United States Patent
Kato et al.

(10) Patent No.: US 10,433,470 B2
(45) Date of Patent: Oct. 1, 2019

(54) CARRIER TAPE, METHOD FOR MANUFACTURING SAME, AND METHOD FOR MANUFACTURING RFID TAG

(71) Applicant: Murata Manufacturing Co., Ltd., Nagaokakyo-shi, Kyoto-fu (JP)

(72) Inventors: Noboru Kato, Nagaokakyo (JP); Kunihiro Komaki, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/679,333

(22) Filed: Aug. 17, 2017

(65) Prior Publication Data

US 2017/0367226 A1    Dec. 21, 2017

Related U.S. Application Data

(60) Division of application No. 15/234,193, filed on Aug. 11, 2016, now Pat. No. 9,775,270, which is a
(Continued)

(30) Foreign Application Priority Data

Nov. 7, 2014  (JP) ................................. 2014-227195
Nov. 27, 2014  (JP) ................................. 2014-239824
(Continued)

(51) Int. Cl.
*H05K 13/00*   (2006.01)
*G06K 19/07*   (2006.01)
(Continued)

(52) U.S. Cl.
CPC .......... *H05K 13/003* (2013.01); *G06K 19/07* (2013.01); *G06K 19/077* (2013.01);
(Continued)

(58) Field of Classification Search
USPC ........................................................ 235/492
See application file for complete search history.

(56) References Cited

U.S. PATENT DOCUMENTS

| | | | |
|---|---|---|---|
| 6,350,954 B1* | 2/2002 | Specks | H01L 23/053 174/255 |
| 8,409,928 B2* | 4/2013 | Grasset | G06K 19/07749 257/E21.499 |

(Continued)

FOREIGN PATENT DOCUMENTS

| CN | 103299325 A | 9/2013 |
|---|---|---|
| CN | 103771024 A | 5/2014 |

OTHER PUBLICATIONS

Kato et al., "Carrier Tape, Method for Manufacturing Same, and Method for Manufacturing RFID Tag", U.S. Appl. No. 15/234,193, filed Aug. 11, 2016.
(Continued)

*Primary Examiner* — Rafferty D Kelly
(74) *Attorney, Agent, or Firm* — Keating & Bennett, LLP

(57) ABSTRACT

A method for manufacturing a carrier tape housing a plurality of electronic components with seal materials includes forming housing holes in tape-shaped main body with first and second principal surfaces along a longitudinal direction of the tape-shaped main body, the housing holes penetrating from the first principal surface to the second principal surface, affixing an adhesive layer of a tape-shaped seal material to the second principal surface of the tape-shaped main body to cover the housing holes, forming cuts in the tape-shaped seal material to separate portions defining and functioning as the seal materials including portions at least partially overlapping with the respective housing holes in a planar view from the other portions, and providing chip-shaped electronic component into each of the housing holes (Continued)

of the tape-shaped main body and fixing the electronic component to the adhesive layer of the seal material exposed in each of the housing holes.

9 Claims, 15 Drawing Sheets

Related U.S. Application Data continuation of application No. PCT/JP2015/080012, filed on Oct. 23, 2015.

(30) Foreign Application Priority Data

| | | |
|---|---|---|
| Feb. 19, 2015 | (JP) | 2015-030318 |
| Mar. 6, 2015 | (JP) | 2015-044178 |
| May 19, 2015 | (JP) | 2015-102092 |

(51) Int. Cl.
*G06K 19/077* (2006.01)
*G09F 3/00* (2006.01)
*H01Q 1/22* (2006.01)
*H05K 1/18* (2006.01)

(52) U.S. Cl.
CPC ... *G06K 19/0776* (2013.01); *G06K 19/07775* (2013.01); *G09F 3/00* (2013.01); *H01Q 1/2208* (2013.01); *H05K 1/185* (2013.01); *H05K 2201/10098* (2013.01)

(56) References Cited

U.S. PATENT DOCUMENTS

| | | | |
|---|---|---|---|
| 2007/0056683 A1* | 3/2007 | Manes | G06K 19/077 156/264 |
| 2009/0033467 A1 | 2/2009 | Finocchiaro et al. | |
| 2013/0200162 A1 | 8/2013 | Dokai et al. | |

OTHER PUBLICATIONS

Official Communication issued in corresponding Chinese Patent Application No. 201580009331.4, dated Apr. 28, 2018.

* cited by examiner

CARRIER TAPE, METHOD FOR MANUFACTURING SAME, AND METHOD FOR MANUFACTURING RFID TAG

CROSS REFERENCE TO RELATED APPLICATIONS

This is a continuation application of international Application No. PCT/JP2015/080012, with an international filing date of Oct. 23, 2015, which claims priority of Japanese Patent Application No. 2014-227195 filed on Nov. 7, 2014, Japanese Patent Application No. 2014-239824 filed on Nov. 27, 2014, Japanese Patent Application No. 2015-030318 filed on Feb. 19, 2015, Japanese Patent Application No. 2015-044178 filed on Mar. 6, 2015, and Japanese Patent Application No. 2015-102092 filed on May 19, 2015, the entire contents of each of the applications are incorporated herein by reference.

BACKGROUND OF THE INVENTION

1. Field of the Invention

The present invention relates to a method for manufacturing an RFID (radio frequency identifier) tag as well as a carrier tape used for manufacturing the RFID tag and a method for manufacturing the same.

2. Description of the Related Art

For an article information management system, an RFID system is recently put to practical use and the RFID system allows a reader/writer and an RFID tag applied to an article to communicate in a noncontact technique utilizing a magnetic field or an electromagnetic field so as to transmit predetermined information.

The RFID tag is manufactured by attaching an RFIC element (an RFIC (radio frequency integrated circuit) chip itself or a package equipped with an RFIC chip) to an antenna base material provided with an antenna element. Conventionally known methods for connecting the RFIC element and the antenna element include methods for connection by heating and melting of solder, a conductive adhesive, etc. (see JP No. 2009-87068 A and JP No. 2009-129093 A) and methods for connection by ultrasonic bonding (see JP No. 2012-32931 A and JP No. 2013-45780 A). However, in the methods for connection by heating and melting of solder, a conductive adhesive, etc., a connection portion between the RFIC element and the antenna element must be heated to the melting point of solder, a conductive adhesive, etc. or higher. In this case, since the antenna base material is required to have high heat resistance, an inexpensive material such as polyethylene terephthalate (PET) cannot be used for the antenna base material. In the methods for connection by ultrasonic bonding, a bump must be melted ultrasonically. This case leads to problems such as a long time required for completing the ultrasonic bonding, and changes in quality and shape of polyethylene terephthalate (PET) that is the antenna base material at the temperature at which the bump melts. If a low-melting-point conductive adhesive is used, a bonding part is easily broken because of low bonding strength, resulting in degradation in electric characteristics and variations in characteristics.

If the antenna base material has flexibility, it is considered that the RFID tag can be affixed to a member having a curved surface or a member having flexibility. However, the conventional methods for connection as described above may cause a stress to concentrate on a connection portion between the RFID element and the antenna element and the connection portion may be destructed. Therefore, a new method is demanded for connecting an electronic component such as the RFIC element and a connection object such as the antenna element.

SUMMARY OF THE INVENTION

Preferred embodiments of the present invention to provide a carrier tape, a method for manufacturing the same, and a method for manufacturing an RFID tag capable of improving handleability of a component used in a new method for connecting an electronic component and a connection object.

A method for manufacturing a carrier tape according to a preferred embodiment of the present invention is a method for manufacturing a carrier tape housing a plurality of electronic components with seal materials, the method including the steps of forming a plurality of housing holes in a tape-shaped main body including a first principal surface and a second principal surface along a longitudinal direction of the tape-shaped main body, the housing holes penetrating from the first principal surface to the second principal surface; affixing an adhesive layer of a tape-shaped seal material to the second principal surface of the tape-shaped main body to cover the plurality of the housing holes; forming cuts in the tape-shaped seal material to separate portions defining and functioning as the seal materials including portions at least partially overlapping with the respective housing holes in a planar view from the other portions, and providing a chip-shaped electronic component into each of the plurality of the housing holes of the tape-shaped main body and fixing the electronic component to the adhesive layer of the seal material exposed in each of the housing holes.

A carrier tape according to a preferred embodiment of the present invention is a carrier tape housing a plurality of electronic components with seal materials, including a tape-shaped main body including a first principal surface and a second principal surface and including a plurality of housing holes penetrating from the first principal surface to the second principal surface along a longitudinal direction; a plurality of seal materials each including an adhesive layer on one principle surface and affixed to the second principal surface of the tape-shaped main body such that the adhesive layer is exposed in at least a portion of each of the housing holes; and a plurality of chip-shaped electronic components housed in the respective housing holes and fixed to the adhesive layers of the respective seal materials.

A method for manufacturing an RFID tag according to a preferred embodiment of the present invention includes the steps of preparing a carrier tape housing a plurality of RFIC elements with seal materials, the carrier tape including a tape-shaped main body including a first principal surface and a second principal surface and including a plurality of housing holes penetrating from the first principal surface to the second principal surface along a longitudinal direction, a plurality of seal materials each including an adhesive layer on one principle surface and affixed to the second principal surface of the tape-shaped main body such that the adhesive layer is exposed in at least a portion of each of the housing holes, and a plurality of RFIC elements housed in the respective housing holes and fixed to the adhesive layers of the respective seal materials; folding the tape-shaped main body to separate each of the RFIC elements with seal materials from the tape-shaped main body; and affixing the separated RFIC element with a seal material to an antenna base material by the adhesive layer of the seal material.

Preferred embodiments of the present invention improve the handleability of a component used in a new method for connecting an electronic component and a connection object.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
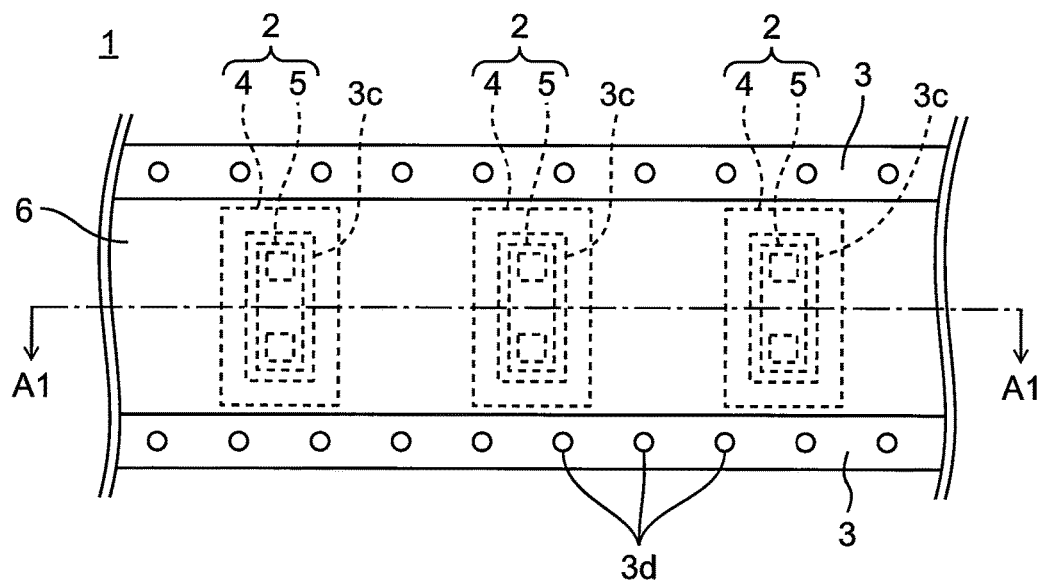
FIG. 1 is a plan view of a general configuration of a carrier tape according to a first preferred embodiment of the present invention.

As described above, a new method for connection is demanded for connecting an electronic component such as an RFIC element and a connection object such as an antenna element. Therefore, the present applicant is making progress in development of an electronic component with a seal material acquired by affixing the electronic component to an adhesive layer on one principal surface of the seal member. This electronic component with a seal material is used in such a manner that the seal member is affixed by the adhesive layer to the connection object so as to bring a terminal electrode on the electronic component into contact with the connection object.

In this case, the terminal electrode of the electronic component is able to be brought into contact with the connection object to retain electric contact between the terminal electrode of the electronic component and the connection object. Additionally, the connection between the electronic component and the connection object is able to be maintained by affixing the seal member to the connection object, and this eliminates the need for direct fixation using ultrasonic etc. or fixation using a bonding material between the terminal electrode of the electronic component and the connection object.

Therefore, even when the connection object is bent, a stress is prevented from concentrating on a connection portion between the electronic component and the connection object, and the connection portion is prevented from being destructed.

As a result of intensive studies for improving the handleability of the electronic component with a seal that is a component used in the new method for connection described above, the following preferred embodiments of the present invention were conceived by the present applicant.

A method for manufacturing a carrier tape according to a preferred embodiment of the present invention is a method for manufacturing a carrier tape housing a plurality of electronic components with seal materials, the method including the steps of forming a plurality of housing holes in a tape-shaped main body including a first principal surface and a second principal surface along a longitudinal direction of the tape-shaped main body, the housing holes penetrating from the first principal surface to the second principal surface; affixing an adhesive layer of a tape-shaped seal material to the second principal surface of the tape-shaped main body to cover the plurality of the housing holes; forming cuts in the tape-shaped seal material to separate portions defining and functioning as the seal materials including portions at least partially overlapping with the respective housing holes in a planar view from the other portions, and providing a chip-shaped electronic component into each of the plurality of the housing holes of the tape-shaped main body and fixing the electronic component to the adhesive layer of the seal material exposed in each of the housing holes.

According to this method for manufacturing, the plurality of the electronic components with seal materials is housed in the carrier tape and, therefore, the handleability of the plurality of the electronic components with seal materials is improved. Additionally, since the seal materials necessary for manufacturing RFID tags are affixed to the second principal surface of the tape-shaped main body to retain the electronic components, it is not necessary to dispose another member unnecessary for manufacturing RFID tags to retain the electronic components in the housing holes. Therefore, manufacturing steps are shortened and manufacturing costs are reduced.

A method for manufacturing a carrier tape may further include a step of affixing a tape-shaped cover material to the first principal surface of the tape-shaped main body to cover the plurality of the housing holes housing the electronic components.

According to this method for manufacturing, dusts etc. are prevented from entering the housing holes housing the electronic components, and the handleability of the electronic components with seal materials is further improved.

A method for manufacturing a carrier tape may further include a step of separating the portions other than those defining and functioning as the seal materials from the tape-shaped main body after the cuts are formed in the tape-shaped seal material.

According to this method for manufacturing, when the electronic components with seal materials are separated from the tape-shaped main body, the electronic components with seal materials are separated after the portions other than those defining and functioning as the seal materials are removed, and therefore is easily removed.

The electronic component may have a terminal electrode on a surface on the side opposite to a fixation surface fixed to the adhesive layer of the seal material.

A carrier tape according to a preferred embodiment of the present invention is a carrier tape housing a plurality of electronic components with seal materials, the carrier tape including a tape-shaped main body including a first principal surface and a second principal surface and including a plurality of housing holes penetrating from the first principal surface to the second principal surface along a longitudinal direction; a plurality of seal materials each including an adhesive layer on one principle surface and affixed to the second principal surface of the tape-shaped main body such that the adhesive layer is exposed in at least a portion of each of the housing holes; and a plurality of chip-shaped electronic components housed in the respective housing holes and fixed to the adhesive layers of the respective seal materials.

According to this carrier tape, the plurality of the electronic components with seal materials is housed in the carrier tape and, therefore, the handleability of the plurality of the electronic components with seal materials is improved. Additionally, since the seal materials necessary for manufacturing RFID tags are affixed to the second principal surface of the tape-shaped main body to retain the electronic components, it is not necessary to dispose another member unnecessary for manufacturing RFID tags for retaining the electronic components in the housing holes. Therefore, manufacturing steps are shortened and manufacturing costs are reduced.

Preferably, the seal materials have rigidity higher than the tape-shaped main body. As a result, when the tape-shaped main body is folded, the separation of the seal materials from the tape-shaped main body is facilitated.

The electronic components may be components that define RFID tags and may each include an RFIC chip and a substrate equipped with the RFIC chip.

The substrate may be a substrate that defines a RFID tag and may include a power feeding circuit for impedance matching between an antenna element and the RFIC chip.

A method for manufacturing an RFID tag according to a preferred embodiment of the present invention includes the steps of preparing a carrier tape housing a plurality of RFIC elements with seal materials, the carrier tape including a tape-shaped main body including a first principal surface and a second principal surface and including a plurality of housing holes penetrating from the first principal surface to the second principal surface along a longitudinal direction, a plurality of seal materials each having an adhesive layer on one principle surface and affixed to the second principal surface of the tape-shaped main body such that the adhesive layer is exposed in at least a portion of each of the housing holes, and a plurality of RFIC elements housed in the respective housing holes and fixed to the adhesive layers of the respective seal materials; folding the tape-shaped main body to separate each of the RFIC elements with seal materials from the tape-shaped main body; and affixing the separated RFIC element with a seal material to an antenna base material by the adhesive layer of the seal material.

According to this method for manufacturing, the RFIC elements with seal materials are the plurality of the electronic components and are housed in the carrier tape and, therefore, the handleability of the plurality of the RFIC elements with seal materials is improved. Additionally, since the seal materials necessary for manufacturing the RFID tags are affixed to the second principal surface of the tape-shaped main body to retain the RFIC elements, it is not necessary to dispose another member unnecessary for manufacturing the RFID tags to retain the RFIC elements in the housing holes. Moreover, since the electronic components with seal materials are separated from the tape-shaped main body by simply folding the tape-shaped main body, manufacturing steps are shortened and manufacturing costs are reduced.

The carrier tape may be wound around a supply reel, and while the carrier tape is continuously pulled out from the supply reel, the tape-shaped main body of the pulled-out carrier tape may be folded at a certain position away from the supply reel to sequentially separate the plurality of the RFIC elements with seal materials from the tape-shaped main body.

According to this method for manufacturing, for example, the plurality of the RFIC elements are able to be separated from the tape-shaped main body at high speed. Consequently, a plurality of RFID tags are able to be manufactured in shorter time.

Preferably, the seal materials have a shape (e.g., a rectangular or substantially rectangular shape) having a longitudinal direction and a transverse direction in a planar view and, when each of the RFIC elements with seal materials is separated from the tape-shaped main body, a portion in the longitudinal direction of the seal material is first separated. As a result, the RFIC elements with seal materials are more easily be separated from the tape-shaped main body.

Preferred embodiments of the present invention will now be described with reference to the drawings.

First Preferred Embodiment

Figure 2:
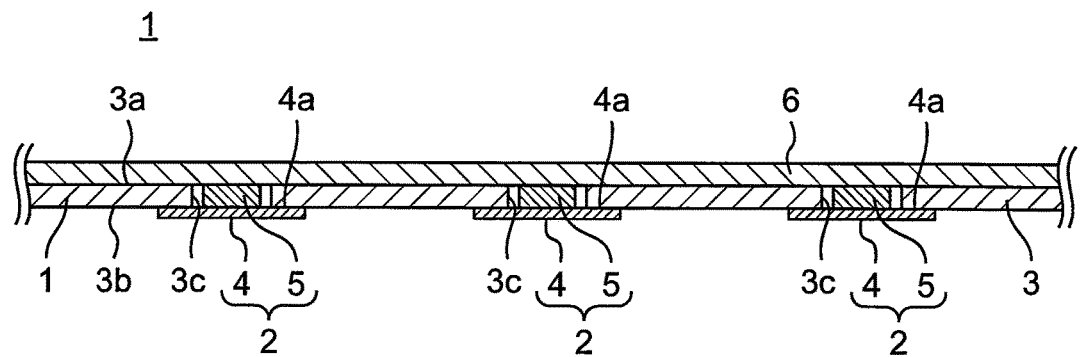
FIG. 2 is a cross-sectional view taken along a line A1-A1 of FIG. 1.
Figure 3:
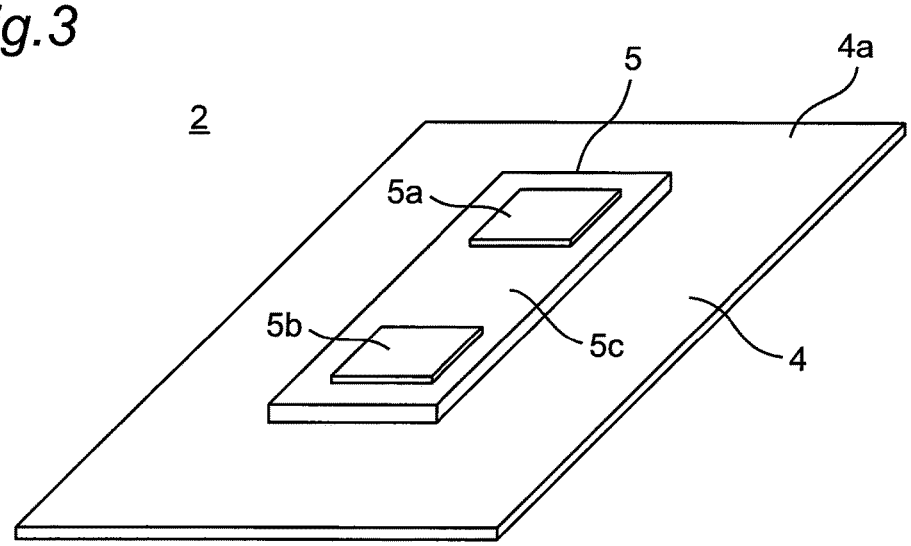
FIG. 3 is a perspective view of a general configuration of an electronic component with a seal material.

FIG. 1 is a plan view of a general configuration of a carrier tape according to a first preferred embodiment of the present invention. FIG. 2 is a cross-sectional view taken along a line A1-A1 of FIG. 1. FIG. 3 is a perspective view of a general configuration of an electronic component with a seal material.

As shown in FIGS. 1 and 2, a carrier tape 1 according to the first preferred embodiment is configured to house a plurality of electronic components 2 with seal materials. More specifically, the carrier tape 1 includes a tape-shaped main body 3, a plurality of seal materials 4, a plurality of chip-shaped electronic components 5, and a tape-shaped cover material 6. The electronic components 2 with seal materials include the seal materials 4 and the electronic components 5.

The tape-shaped main body 3 includes a first principal surface 3a and a second principal surface 3b. The first principal surface 3a and the second principal surface 3b are subjected to a release treatment. The tape-shaped main body 3 is provided with a plurality of housing holes 3c penetrating from the first principal surface 3a to the second principal surface 3b. The plurality of the housing holes 3c is arranged in the longitudinal direction of the tape-shaped main body 3. The arrangement intervals of the housing holes 3c are equal or substantially equal intervals, for example. The housing holes 3c have a size slightly larger than the electronic components 5 so that the electronic components 5 are entirely housed in a planar view while a gap of about 0.1 mm to about 2 mm, for example, is formed around the electronic components 5. The "planar view" as used herein refers to a state viewed in the direction shown in FIG. 1. The tape-shaped main body 3 includes a member having flexibility such as polyethylene terephthalate (PET) and paper, for example. The thickness of the tape-shaped main body 3 is about 50 μm to about 800 μm, for example. The thickness of the tape-shaped main body 3, i.e., the depth of the housing holes 3c, is the same or substantially the same as the thickness of the electronic components 5 or thinner than the thickness of the electronic components 5.

The seal materials 4 are affixed to, for example, an antenna base material 11 described later to retain an electrical connection between an antenna element 12 that is an example of a connection object, and the electronic component 5. Each of the seal materials 4 includes an adhesive layer 4a on one principal surface. The adhesive layer 4a is provided on the one entire principal surface of the seal material 4, for example. The seal materials 4 are affixed to the second principal surface 3b of the tape-shaped main body 3 such that the adhesive layers 4a are exposed in the housing holes 3c. In the first preferred embodiment, the seal materials 4 preferably have a size larger than the housing holes 3c so as to completely cover the housing holes 3c. The seal material 4 include members having flexibility and elasticity such as polyethylene, polypropylene, polyvinyl butyral (PVB), and paper, for example. The thickness of the seal materials 4 is about 20 μm to about 200 μm, for example.

The electronic components 5 are housed in the housing holes 3c and fixed to the adhesive layers 4a of the seal materials 4. In the first preferred embodiment, the electronic components 5 are RFIC elements (packages or straps with RFIC chips sealed therein), for example. The RFIC elements are ultrathin packages, for example. As shown in FIG. 3, each of the electronic components 5 includes a first terminal electrode 5a and a second terminal electrode 5b on a surface on the side opposite to a fixation surface fixed to the adhesive layer 4a of the seal material 4. The first terminal electrode 5a and the second terminal electrode 5b are provided on a substrate 5c including an RFIC chip. The substrate 5c is made of a flexible material such as a liquid crystal polymer resin or a polyimide resin. The height (thickness) of the electronic component 5 is about 50 μm to about 1 mm, for example.

The tape-shaped cover material 6 is affixed to the first principal surface 3a of the tape-shaped main body 3 to cover the plurality of the housing holes 3c housing the electronic components 5. One surface of the tape-shaped cover material 6 has weak adhesiveness so as to facilitate separation even when the electronic components 5 housed in the housing holes 3c are affixed thereto. The tape-shaped cover material 6 has a width shorter than the tape-shaped main body 3 and is affixed to the tape-shaped main body 3 such that the first principal surface 3a of the tape-shaped main body 3 is exposed at both end portions in the width direction. The both end portions in the width direction of the tape-shaped main body 3 is provided with a plurality of feed holes 3d along the longitudinal direction of the tape-shaped main body 3. The tape-shaped cover material 6 is preferably made of a flexible material such as polystyrene, for example. The thickness of the tape-shaped cover material 6 is about 50 μm to about 200 μm, for example.

According to the carrier tape according to the first preferred embodiment, the plurality of the electronic components 2 with seal materials is housed in the carrier tape 1 and, therefore, the handleability of the plurality of the electronic components 2 with seal materials is improved. Additionally, since the seal materials 4 necessary for manufacturing RFID tags are affixed to the second principal surface 3b of the tape-shaped main body 3 to retain the electronic components 5, it is not necessary to dispose another member unnecessary for manufacturing RFID tags to retain the electronic components 5 in the housing holes 3c. Therefore, manufacturing steps are shortened and manufacturing costs are reduced.

Although the electronic components 5 preferably are RFIC elements in the first preferred embodiment, this is not a limitation of the present invention. If the electronic components 2 with seal materials are used for a purpose other than manufacturing of RFID tags, the electronic components 5 may be components other than the RFIC elements. For example, the electronic components 5 may be temperature sensors, acceleration sensors, etc. In this case, a plurality of sensor components with seal materials may be housed in a carrier tape, and the carrier tape may be used to affix the sensor components with seal materials to articles that are an example of the connection object such as a carrying case. As a result, the plurality of the sensor components are able to be mounted on articles at high speed.

Although the adhesive layer 4a is provided on the one entire principal surface of the seal material 4, this is not a limitation of the present invention. The adhesive layer 4a may be dispersedly disposed at necessary positions on the one principal surface of the seal material 4.

A method for manufacturing a carrier tape according to the first preferred embodiment will be described. FIGS. 4A to 4G are a cross-sectional views of an example of the method for manufacturing a carrier tape according to the first preferred embodiment.

Figure 4A:
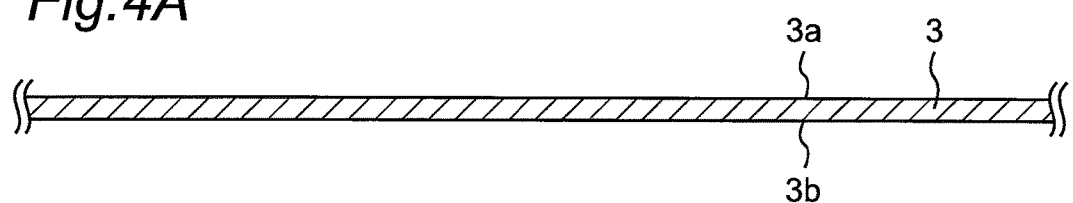
FIG. 4A is a cross-sectional view of an example of a method for manufacturing the carrier tape of FIG. 1.

First, as shown in FIG. 4A, the belt-shaped tape-shaped main body 3 is prepared.

Figure 4B:
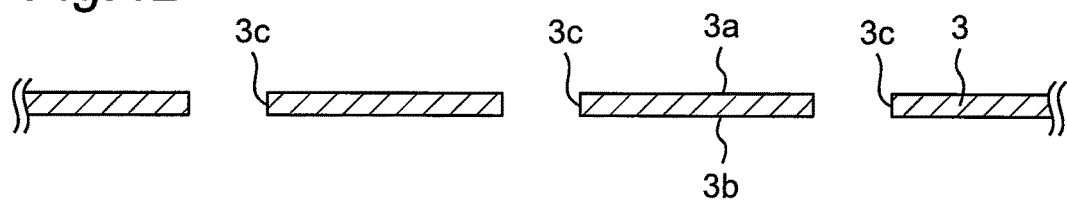
FIG. 4B is a cross-sectional view of a step continued from FIG. 4A.

As shown in FIG. 4B, the plurality of the housing holes 3c penetrating from the first principal surface 3a to the second principal surface 3b are arranged along the longitudinal direction of the tape-shaped main body 3.

Figure 4C:
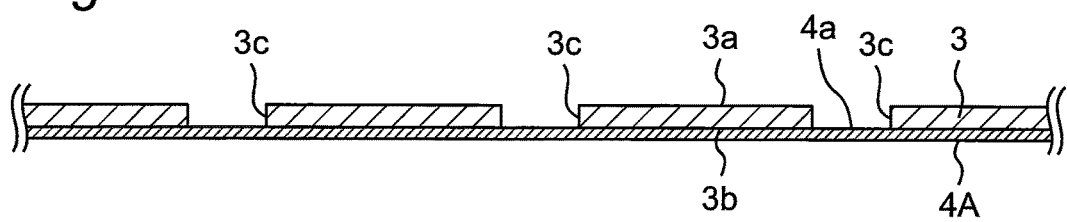
FIG. 4C is a cross-sectional view of a step continued from FIG. 4B.

As shown in FIG. 4C, the adhesive layer 4a of a tape-shaped seal material 4A also being belt-shaped and made of the same material as the seal materials 4 is affixed to the second principal surface 3b of the tape-shaped main body 3 so as to cover the plurality of the housing holes 3c.

Figure 4D:
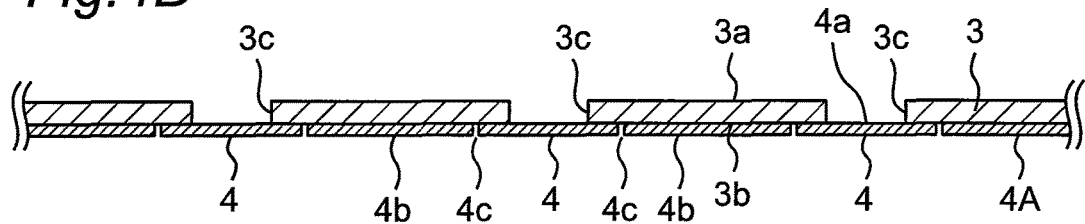
FIG. 4D is a cross-sectional view of a step continued from FIG. 4C.

As shown in FIG. 4D, cuts 4c are formed in the tape-shaped seal material 4A such that portions defining and functioning as the seal materials 4 including portions overlapping with the housing holes 3c in the planar view are separated from other portions 4b. In this case, the cuts reach the second principal surface 3b of the tape-shaped main body 3.

Figure 4E:
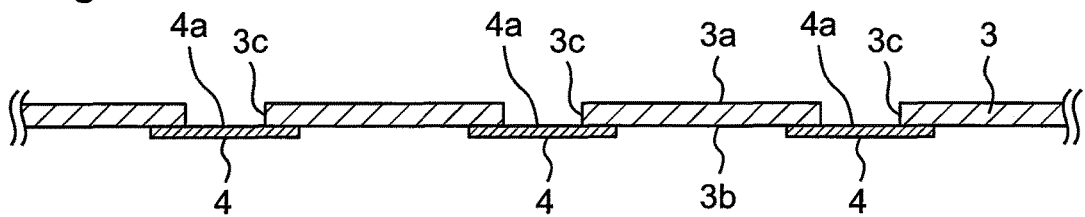
FIG. 4E is a cross-sectional view of a step continued from FIG. 4D.

As shown in FIG. 4E, the other portions 4b are separated from the tape-shaped main body 3. The other portions 4b are connected in the longitudinal direction of the tape-shaped seal material 4A and therefore are able to be sequentially peeled off from the tape-shaped main body 3.

Figure 4F:
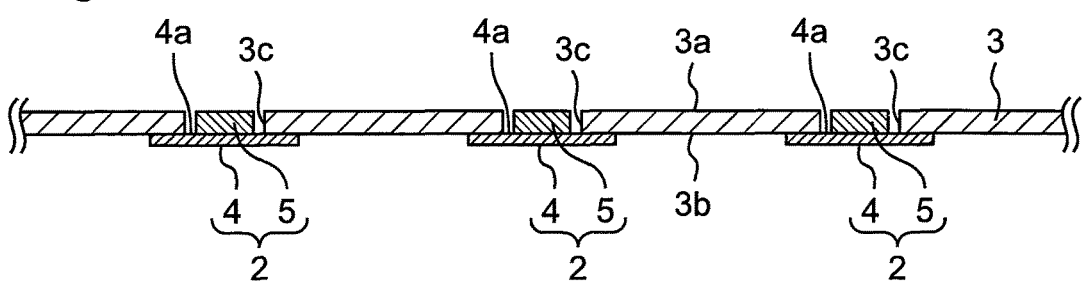
FIG. 4F is a cross-sectional view of a step continued from FIG. 4E.
Figure 4G:
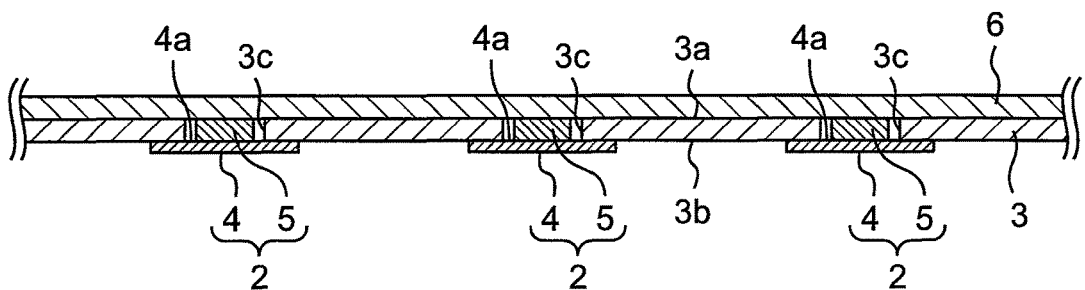
FIG. 4G is a cross-sectional view of a step continued from FIG. 4F.

As shown in FIG. 4F, the electronic components 5 are housed in the plurality of the respective housing holes 3c of the tape-shaped main body 3 and the electronic components 5 are fixed to the adhesive layers 4a of the seal materials 4 exposed in the housing holes 3c.

The tape-shaped cover material 6 is affixed to the first principal surface 3a of the tape-shaped main body 3 to cover the plurality of the housing holes 3c housing the electronic components 5. The seal materials 4 and the tape-shaped cover material 6 have flexibility, and the thickness of the electronic components 5 is the same or substantially the same as or greater than the depth of the housing holes 3c. Therefore, a pressure is applied to connection surfaces between the electronic components 5 and the seal materials 4 at a step of affixing the tape-shaped cover material 6, so that the electronic components 5 and the seal materials 4 are strongly bonded.

According to the method for manufacturing a carrier tape according to the first preferred embodiment, the plurality of the electronic components 2 with seal materials is housed in the carrier tape 1 and, therefore, the handleability of the plurality of the electronic components 2 with seal materials is improved. Particularly, rather than housing the electronic components 2 with seal materials into the carrier tape 1, the seal materials 4 are affixed in advance to the carrier tape 1, and the electronic components 5 are retained by the seal materials 4 at the step of housing the electronic components 5 into the housing holes 3c. Therefore, the electronic components 2 with seal materials are significantly improved in manufacturing efficiency and reliability. Additionally, since the seal materials 4 necessary for manufacturing RFID tags are affixed to the second principal surface 3b of the tape-shaped main body 3 to retain the electronic components 5, it is not necessary to dispose another member unnecessary for manufacturing RFID tags to retain the electronic components 5 in the housing holes 3c. Therefore, manufacturing steps are shortened and manufacturing costs are reduced.

According to the method for manufacturing a carrier tape according to the first preferred embodiment, the tape-shaped cover material 6 is affixed to the first principal surface 3a of the tape-shaped main body 3. Therefore, dusts etc. are prevented from entering the housing holes 3c housing the electronic components 5, and the handleability of the electronic components 2 with seal materials is further improved.

According to the method for manufacturing a carrier tape according to the first preferred embodiment, the cuts 4c are formed in the tape-shaped seal material 4A before separating the portions 4b other than those defining and functioning as the seal materials 4 from the tape-shaped main body 3. As a result, when the electronic components 2 with seal materials are separated from the tape-shaped main body 3, the electronic components 2 with seal material are separated after the portions 4b other than those defining and functioning as the seal materials 4 are removed, and therefore are able to be easily removed.

Although the tape-shaped cover material 6 is affixed to the first principal surface 3a of the tape-shaped main body 3 in the first preferred embodiment, this is not a limitation of the present invention. For example, if the first principal surface 3a having the plurality of the electronic components 2 with seal materials attached thereto (in the state shown in FIG. 4F) is wound around a reel, the second principal surface 3b of the tape-shaped main body 3 abutting on the inside fulfills the function of the tape-shaped cover material 6. Such a case eliminates the need for the tape-shaped cover material 6. In the case of winding the tape-shaped main body 3 around a reel, if the electronic components 5 are made thicker than the tape-shaped main body 3, the electronic components 5 are pushed against the seal materials 4 and the adhesion strength is increase between the electronic components 5 and the seal materials 4. As a result, when the electronic components 2 with seal materials are separated from the tape-shaped main body 3, the electronic components 5 hardly come off.

Although after the cuts 4c are formed in the tape-shaped seal material 4A, the portions 4b other than those defining and functioning as the seal materials 4 are separated from the tape-shaped main body 3 in the first preferred embodiment, this is not a limitation of the present invention. The adhesion between the other portions 4b and the tape-shaped main body 3, the size of the cuts 4c, etc. may be adjusted such that when the electronic components 2 with seal materials are separated from the tape-shaped main body 3, the separation is not prevented by the portions 4b other than those defining and functioning as the seal materials 4. This eliminates the need to separate the other portions 4b from the tape-shaped main body 3.

Figure 5:
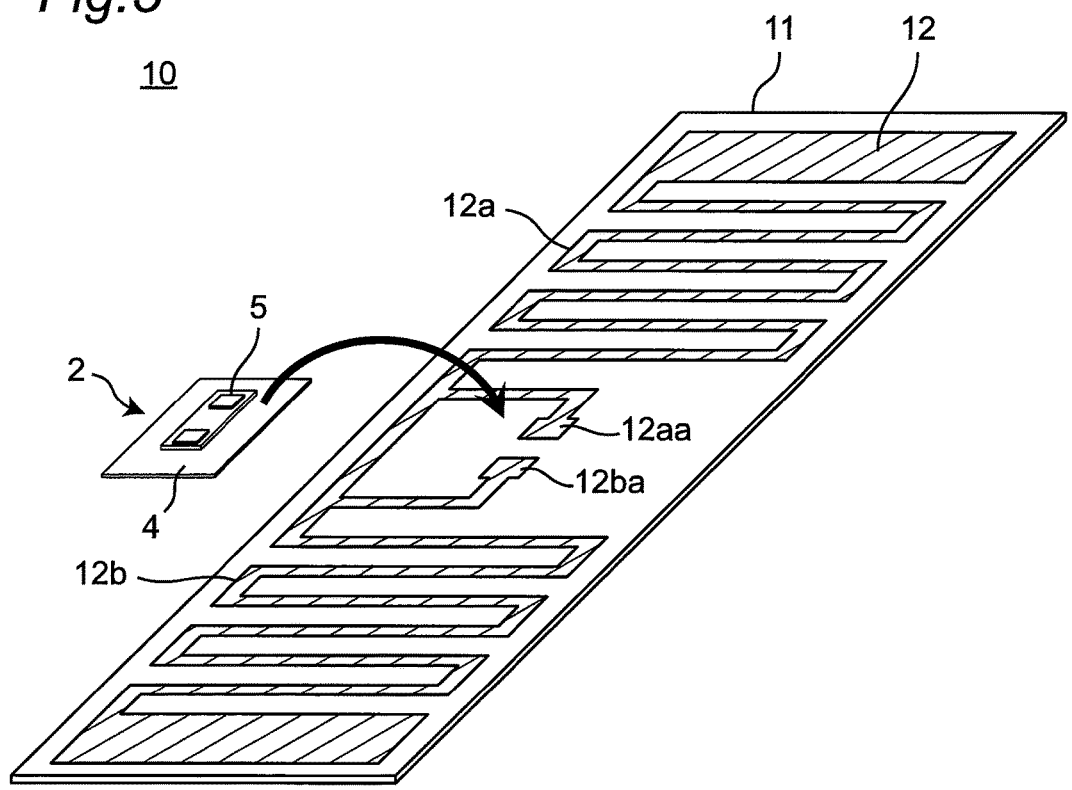
FIG. 5 is a perspective view of a method for manufacturing an RFID tag.
Figure 6:
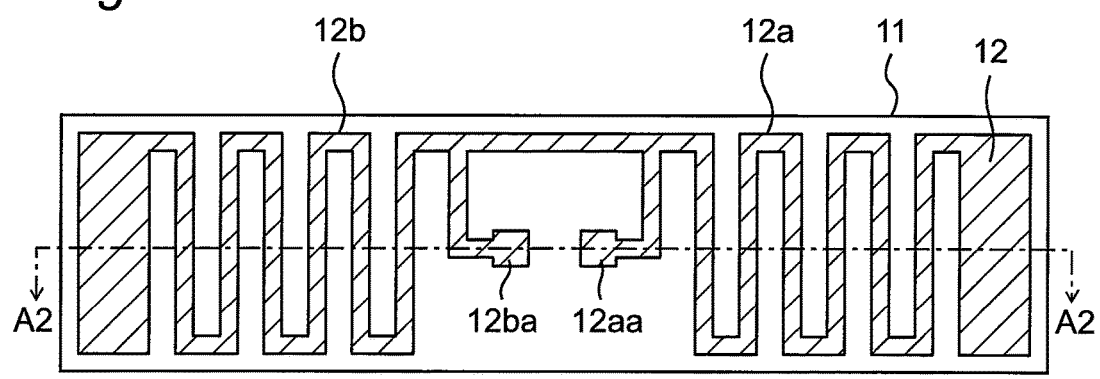
FIG. 6 is a plane view of an antenna element and an antenna base material.
Figure 7:
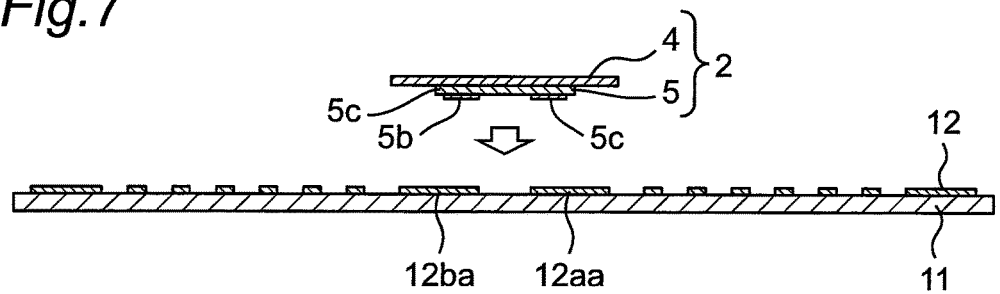
FIG. 7 is a cross-sectional view taken along a line A2-A2 of FIG. 6.
Figure 8:
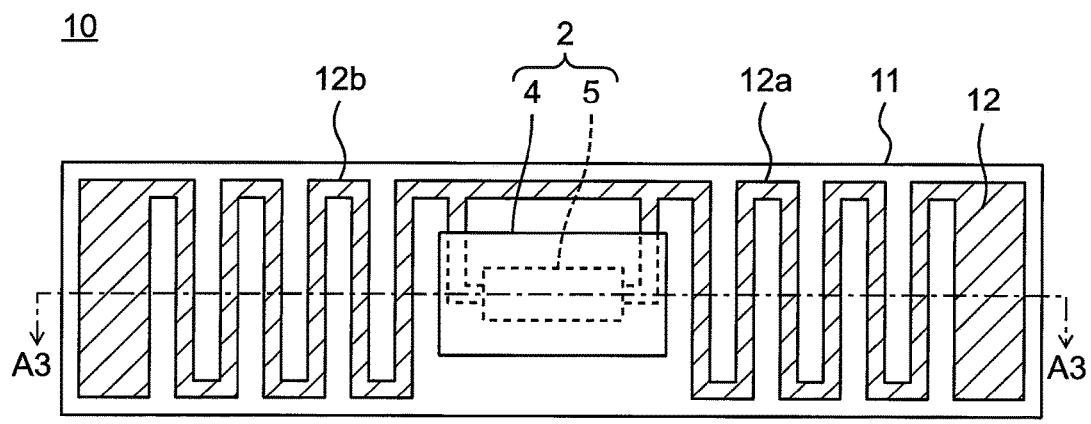
FIG. 8 is a plane view of a state in which the electronic component with a seal material is attached onto the antenna element.
Figure 9:
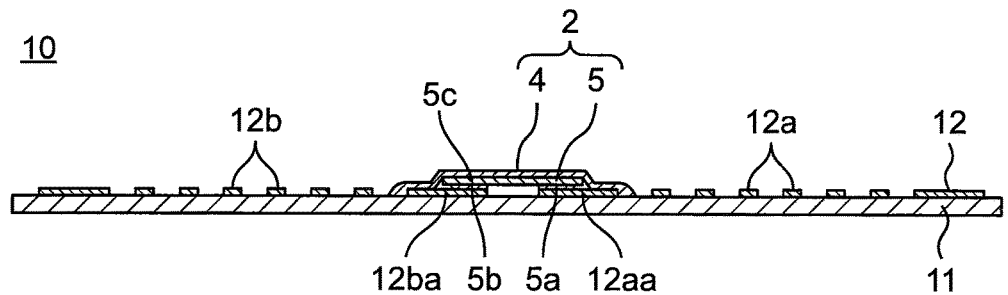
FIG. 9 is a cross-sectional view taken along a line A3-A3 of FIG. 8.

A method for manufacturing an RFID tag 10 by using the electronic component 2 with a seal material (RFIC element 2 with a seal material) will be described. FIG. 5 is a perspective view of the method for manufacturing the RFID tag 10. FIG. 6 is a plane view of the antenna base material 11 and the antenna element 12 that are components of the RFID tag 10. FIG. 7 is a cross-sectional view taken along a line A2-A2 of FIG. 6. FIG. 8 is a plane view of a state in which the electronic component 2 with a seal material is attached onto the antenna element 12. FIG. 9 is a cross-sectional view taken along a line A3-A3 of FIG. 8.

As shown in FIGS. 5 to 9, the RFID tag 10 is manufactured by attaching the electronic component 2 with a seal material to the antenna element 12 on one principal surface of the antenna base material 11. The RFID tag 10 is, for example, an RFID tag using the 900 MHz band as a communication frequency.

The antenna base material 11 preferably includes a flexible material such as polyethylene terephthalate (PET) and paper. One principal surface is provided with the antenna element 12 made of copper foil or aluminum foil or silver paste.

The antenna element 12 preferably is formed into a meandering shape, for example, and includes antenna conductors 12a, 12b defining and functioning as a dipole antenna. A first end portion 12aa and a second end portion 12ba are an end portion of the antenna conductor 12a and an end portion of the antenna conductor 12b, respectively, and are spaced away from each other. An interval between the first end portion 12aa and the second end portion 12ba is identical or substantially identical to an interval between the first terminal electrode 5a and the second terminal electrode 5b of the electronic component (RFIC element) 5.

The seal material 4 of the electronic component 2 with a seal material is affixed by the adhesive layer 4a to the antenna base material 11 such that the first end portion 12aa and the second end portion 12ba are brought into contact with the first terminal electrode 5a and the second terminal electrode 5b, respectively. As a result, the RFID tag 10 is completed.

In this case, the first end portion 12aa and the first terminal electrode 5a as well as the second end portion 12ba and the second terminal electrode 5b are not directly fixed to each other although they are electrically connected. Therefore, even when the antenna base material 11 is bent, the first end portion 12aa and the first terminal electrode 5a as well as the second end portion 12ba and the second terminal electrode 5b slide at respective connection portions and, therefore, no stress concentrates on the connection portions. Therefore, degradation in reliability of the connection is able to be suppressed between the electronic component 2 with a seal material and the antenna element 12. Since the electronic component 2 with a seal material defines a convex portion toward the seal material 4 on the terminal electrode side of the electronic component 5, when the seal material 4 adheres to the antenna base material 11, a pressure pressing against the antenna base material 11 is applied to the electronic component 5. As a result, since the first terminal electrode 5a and the second terminal electrode 5b of the electronic component 5 are pressed against the first end portion 12aa and the second end portion 12ba of antenna electrodes, stable electric connection is maintained.

Although the antenna conductors 12a, 12b preferably have a meandering shape in the first preferred embodiment, this is not a limitation of the present invention. The antenna conductors 12a, 12b may be formed into, for example, a rectangular or substantially rectangular belt shape or other shapes. Although the antenna conductors 12a, 12b define and function as a dipole antenna, this is not a limitation of the present invention. The antenna conductors 12a, 12b may define and function as a loop type antenna or may act as other types of antenna.

Figure 10:
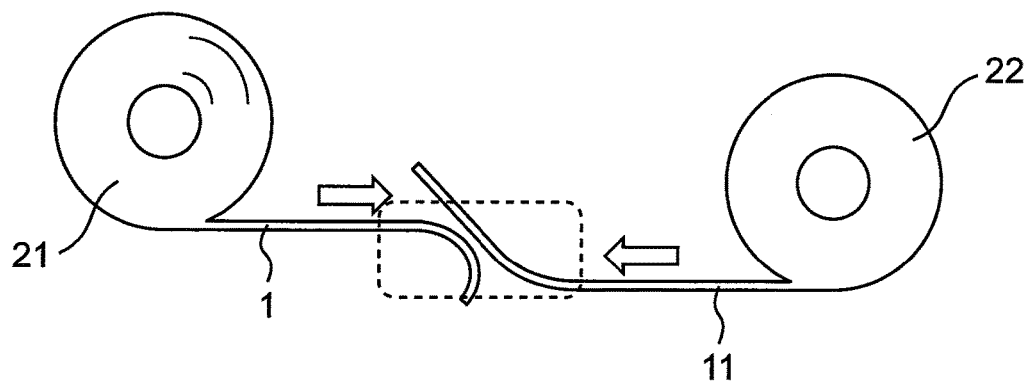
FIG. 10 is a side view of an example of a method for manufacturing a plurality of RFID tags by using the carrier tape of FIG. 1.
Figure 11:
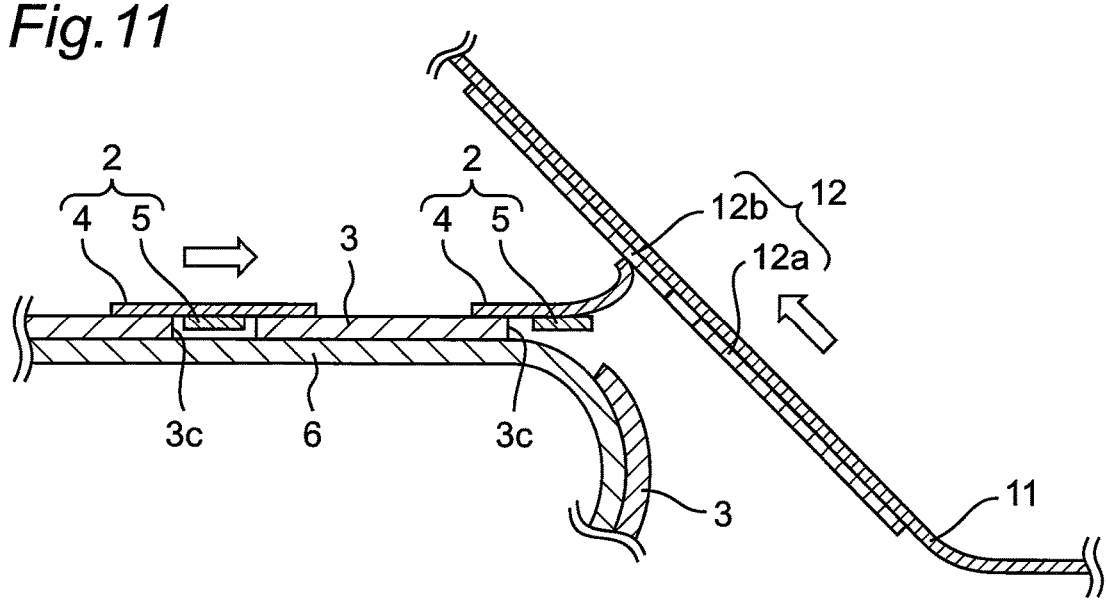
FIG. 11 is an enlarged cross-sectional view of a portion surrounded by a dotted line of FIG. 10.

A method for manufacturing a plurality of the RFID tags 10 by using the carrier tape 1 will be described. FIG. 10 is a side view of an example of the method for manufacturing a plurality of the RFID tags 10 by using the carrier tape 1. FIG. 11 is an enlarged cross-sectional view of a portion surrounded by a dotted line of FIG. 10.

First, as shown in FIG. 10, a supply reel 21 is prepared with the carrier tape 1 wound therearound. The plurality of the antenna base materials 11 including the antenna elements 12 provided thereon as shown in FIG. 16 is connected in series and formed into a tape shape to prepare a supply reel 22 with the plurality of the antenna base materials 11 wound therearound.

The carrier tape 1 is continuously pulled out from the supply reel 21 while pulling out the antenna base materials 11 including the antenna elements 12 thereon from the supply reel 22, and the carrier tape 1 and the antenna base materials 11 are brought closer to each other.

As shown in FIG. 11, the tape-shaped main body 3 of the carrier tape 1 is folded (bent) in the vicinity of the antenna base materials 11 to separate the electronic component 2 with a seal material from the tape-shaped main body 3. At the time of separation, while the electronic component 2 with a seal material is being separated from the tape-shaped main body 3, the electronic component 2 with a seal material is affixed to the antenna conductors 12a, 12b of the antenna element 12 transported in the direction intersecting with the transport direction of the carrier tape 1.

For example, by folding the tape-shaped main body 3 of the carrier tape 1 in the vicinity of the antenna base materials 11, one end portion of the seal material 4 first peels off from the tape-shaped main body 3. The one end portion of the seal material 4 adheres by the adhesive force of the adhesive layer 4a to the antenna conductor 12b of the antenna element 12 transported in the direction intersecting with the transport direction of the carrier tape 1. Subsequently, as the carrier tape 1 and the antenna element 12 further move, the other end portion of the seal material 4 peels off from the tape-shaped main body 3. The other end portion of the seal material 4 adheres by the adhesive force of the adhesive layer 4a to the antenna conductor 12a of the antenna element 12 transported in the direction intersecting with the transport direction of the carrier tape 1. As a result, the RFID tag 10 shown in FIG. 8 is manufactured. By sequentially performing this operation, a plurality of RFID tags 10 are able to be manufactured.

According to the method for manufacturing an RFID tag according to the first preferred embodiment, the plurality of the electronic components 2 with seal materials is housed in the carrier tape 1 and, therefore, the handleability of the plurality of the electronic components 2 with seal materials is improved. Additionally, since the seal materials 4 necessary for manufacturing the RFID tags 10 are affixed to the second principal surface 3b of the tape-shaped main body 3 to retain the electronic components 5, it is not necessary to dispose another member unnecessary for manufacturing the RFID tags 10 to retain the electronic components 5 in the housing holes 3c. Moreover, since the electronic components 2 with seal materials are able to be separated from the tape-shaped main body 3 by simply folding the tape-shaped main body 3, manufacturing steps are shortened and manufacturing costs are reduced. An angle of the fold of the tape-shaped main body 3 and a degree of curvature at the folded position may appropriately be set in consideration of the adhesive force between the electronic components 2 with seal materials and the tape-shaped main body 3 etc.

According to the method for manufacturing an RFID tag according to the first preferred embodiment, while the carrier tape 1 is continuously pulled out from the supply reel 21, the tape-shaped main body 3 of the pulled-out carrier tape 1 is folded at a certain position away from the supply reel 21. As a result, the plurality of the electronic components 2 with seal materials is sequentially separated from the tape-shaped main body 3 and sequentially affixed to the antenna conductors 12a, 12b of the antenna elements 12 pulled out from the supply reel 22. Therefore, for example, the carrier tape 1 can be pulled out at a rate of several dozen m per minute to separate the plurality of the electronic components 5 from the tape-shaped main body 3 at high speed. Consequently, a plurality of the RFID tags 10 are able to be manufactured in shorter time.

Preferably, the seal materials 4 have a rectangular or substantially rectangular shape and, when the electronic components 2 with seal materials are each separated from the tape-shaped main body 3, a portion in the longitudinal direction of the seal material 4 is first separated. As a result, the electronic components 2 with seal materials are able to be more easily separated from the tape-shaped main body 3.

The seal materials 4 preferably have rigidity higher than the tape-shaped main body 3. As a result, when the tape-shaped main body 3 is folded, the separation of the seal materials 4 from the tape-shaped main body 3 is facilitated. Therefore, the seal materials 4 are preferably made of a material having quality or property associated with a larger elastic force (resilience), such as a larger Young's modulus and a greater thickness, than the tape-shaped main body 3.

The carrier tape 1 after the separation of the electronic components 2 with seal materials may be wound around a winding reel (not shown). In particular, the carrier tape 1 may be transported by a roll-to-roll technique. Similarly, the antenna base materials 11 including the antenna elements 12 thereon may be transported by a roll-to-roll technique.

In the example of manufacturing shown in FIGS. 10 and 11, the electronic components 2 with seal materials separated from the tape-shaped main body 3 are directly affixed to the antenna conductors 12a, 12b, this is not a limitation of the present invention. For example, as shown in FIGS. 12 and 13, the electronic components 2 with seal materials separated from the tape-shaped main body 3 may be affixed to the antenna conductors 12a, 12b by using a conveyer 23.

More specifically, the carrier tape 1 pulled out from the supply reel 21 is folded at a certain position away from the supply reel 21 to separate the electronic component 2 with a seal material from the tape-shaped main body 3. The separated electronic component 2 with a seal material is conveyed by the conveyer 23 to the vicinity of the antenna base material 11 including the antenna element 12 thereon pulled out from the supply reel 22. As a result, the one end portion of the seal material 4 of the electronic component 2 with a seal material is affixed to the antenna conductor 12b, and the other end portion of the seal material 4 is affixed to the antenna conductor 12a. By sequentially performing this operation, a plurality of RFID tags 10 are able to be manufactured.

According to this configuration, the adjustment of machinery is made easier and the electronic components 2 with seal materials are able to be more accurately affixed to the antenna conductors 12a, 12b.

Figure 12:
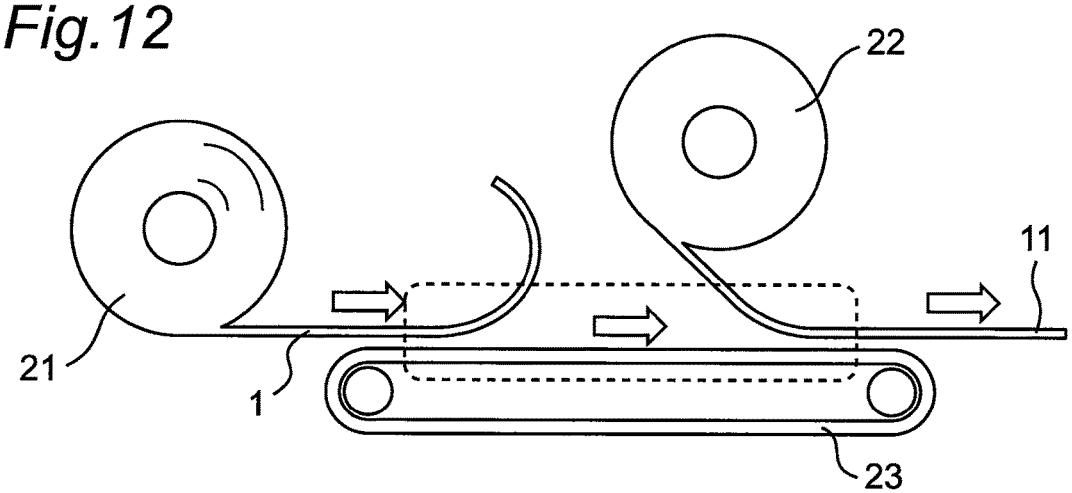
FIG. 12 is a side view of another example of the method for manufacturing a plurality of RFID tags by using the carrier tape of FIG. 1.
Figure 13:
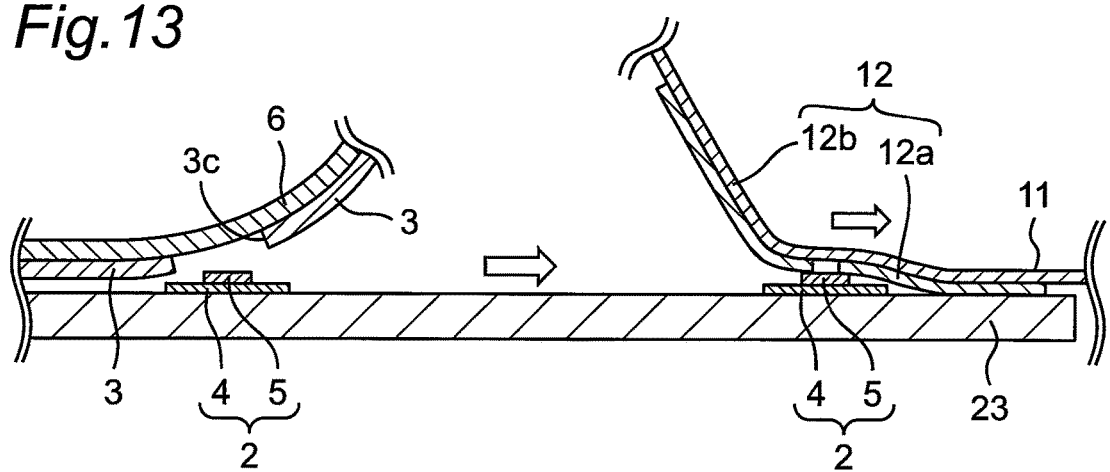
FIG. 13 is an enlarged cross-sectional view of a portion surrounded by a dotted line of FIG. 12.

The conveyer 23 may be an apparatus such as a suction head instead of a belt-conveyor-type apparatus as shown in FIGS. 12 and 13. In particular, the electronic component 2 with a seal material separated from the tape-shaped main body 3 may be sucked by a suction head and affixed to the antenna conductors 12a, 12b of the antenna element 12.

Description will be made of a specific configuration of an RFIC element 100 that is an example of the electronic component 5.

Figure 14:
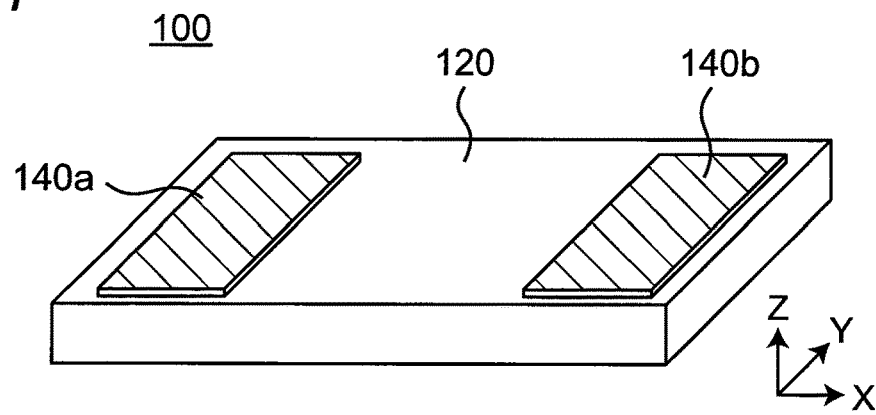
FIG. 14 is a perspective view of an RFIC element that is an example of an electronic component.

FIG. 14 is a perspective view of the RFIC element 100. The RFIC element 100 preferably is an RFIC element corresponding to a communication frequency of, for example, the 900 MHz band, i.e., the UHF band. The RFIC element 100 includes a multilayer substrate 120 with a principal surface defining a rectangle. The multilayer substrate 120 has flexibility. For example, the multilayer substrate 120 has a structure of a laminated body acquired by laminating flexible resin insulation layers of polyimide, liquid crystal polymer, etc. The insulation layers made of these materials have the permittivity smaller than that of ceramic base material layers represented by LTCC.

Hereinafter, for convenience of description, a longitudinal direction of the multilayer substrate 120 is indicated by an X-axis, a width direction of the multilayer substrate 120 is indicated by a Y-axis, and a thickness direction of the multilayer substrate 120 is indicated by a Z-axis.

Figure 15:
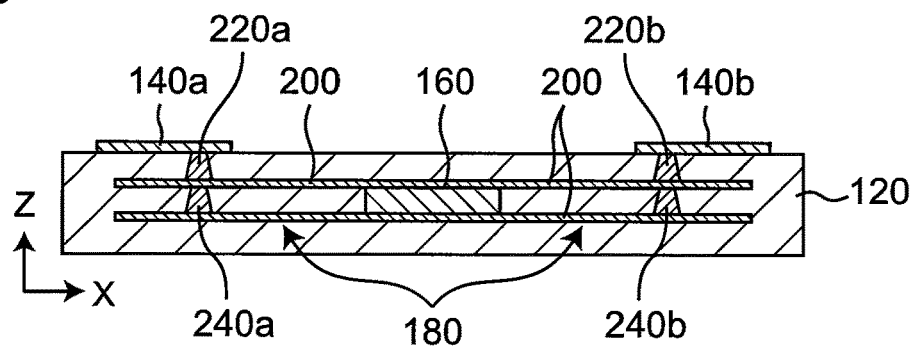
FIG. 15 is a transverse cross-sectional view of the RFIC element shown in FIG. 14.
Figure 16A:
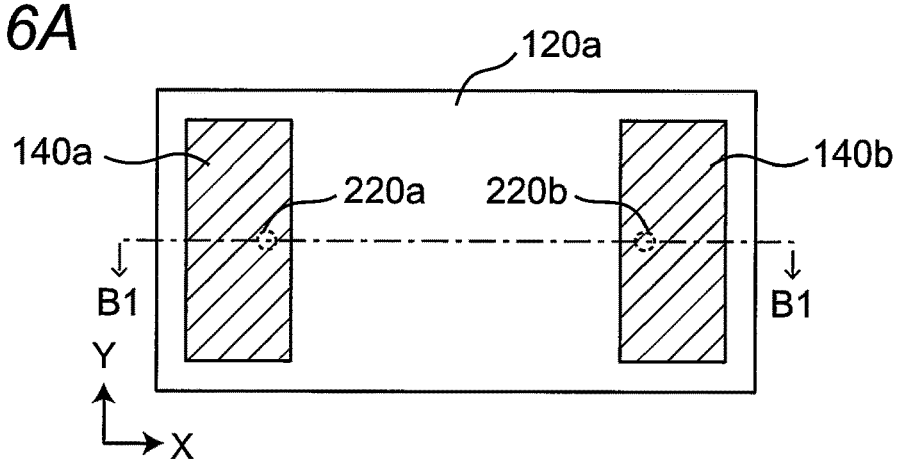
FIG. 16A is a plane view of an upper insulation layer of a multilayer substrate making up the RFIC element shown in FIG. 14 viewed from directly above.
Figure 16B:
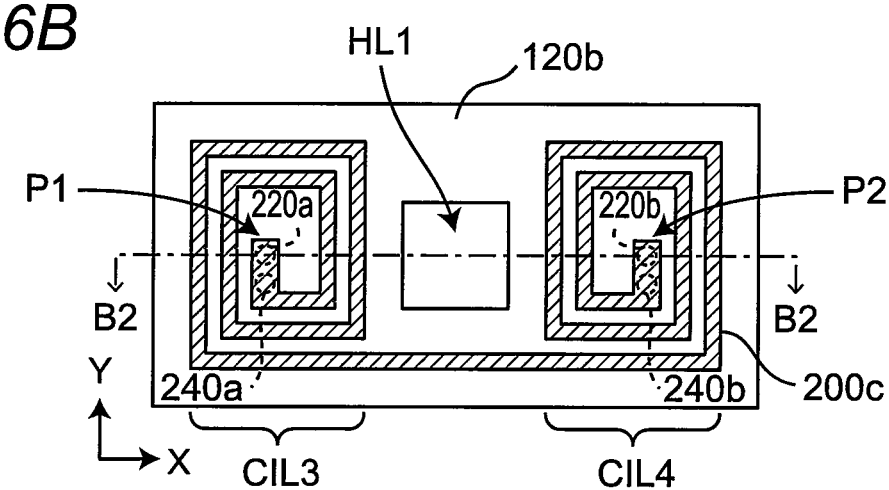
FIG. 16B is a plane view of an intermediate insulation layer of the multilayer substrate making up the RFIC element shown in FIG. 14 viewed from directly above.
Figure 16C:
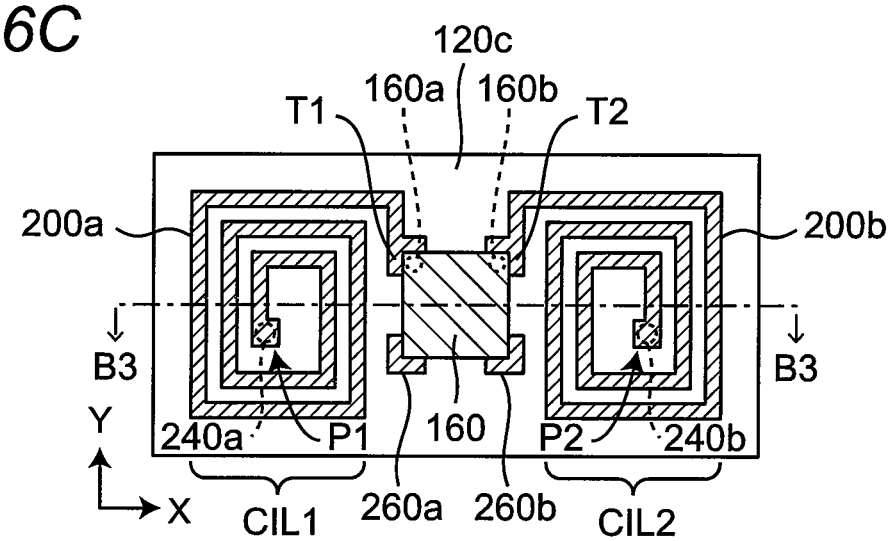
FIG. 16C is a plane view of a lower insulation layer of the multilayer substrate making up the RFIC element shown in FIG. 14 viewed from directly above.
Figure 17A:
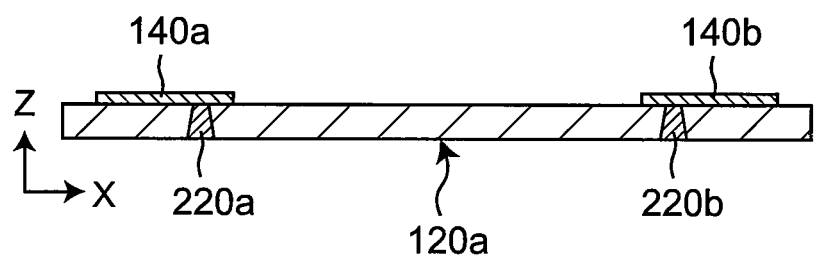
FIG. 17A is a cross-sectional view of the insulation layer shown in FIG. 16A taken along a line B1-B1.
Figure 17B:
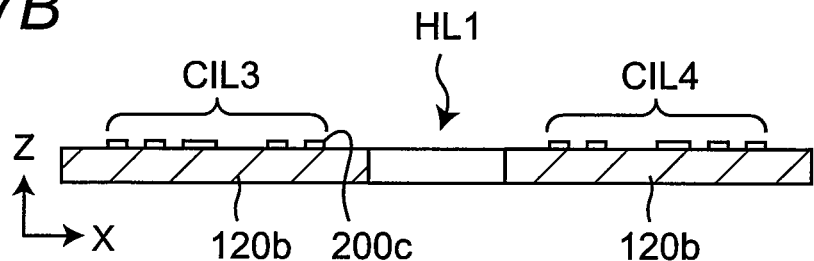
FIG. 17B is a cross-sectional view of the insulation layer shown in FIG. 16B taken along a line B2-B2.
Figure 17C:
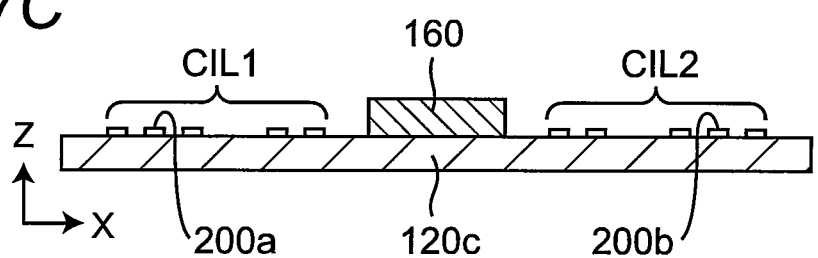
FIG. 17C is a cross-sectional view of the insulation layer shown in FIG. 16C taken along a line B3-B3.

FIG. 15 is a transverse cross-sectional view of the RFIC element shown in FIG. 14. FIG. 16A is a plane view of an upper insulation layer of the multilayer substrate 120 viewed from directly above. FIG. 16B is a plane view of an intermediate insulation layer of the multilayer substrate 120 viewed from directly above. FIG. 16C is a plane view of a lower insulation layer of the multilayer substrate 120 viewed from directly above. FIG. 17A is a cross-sectional view of the insulation layer shown in FIG. 16A taken along a line B1-B1. FIG. 17B is a cross-sectional view of the insulation layer shown in FIG. 16B taken along a line B2-B2. FIG. 17C is a cross-sectional view of the insulation layer shown in FIG. 16C taken along a line B3-B3.

As shown in FIG. 15, an RFIC chip 160 and a power feeding circuit 180 are built into the multilayer substrate 120. A first terminal electrode 140a and a second terminal electrode 140b are provided on one principal surface of the multilayer substrate 120.

The RFIC chip 160 has a structure in which various elements are built into a hard semiconductor substrate made of a semiconductor such as silicon. The both principal surfaces of the RFIC chip 160 are preferably square or substantially square. As shown in FIG. 16C, a first input/output terminal 160a and a second input/output terminal 160b are provided on the other principal surface of the RFIC chip 160. The RFIC chip 160 is located at the center in each of the X-, Y-, and Z-axes inside the multilayer substrate 120 in a posture in which the sides of the square extends along the X-axis or the Y-axis and the one principal surface and the other principal surface face the positive side and the negative side, respectively, in the Z-axis direction.

The power feeding circuit 180 includes a coil conductor 200 and interlayer connection conductors 240a, 240b. The coil conductor 200 includes coil patterns 200a to 200c shown in FIG. 16B or 16C. A portion of the coil pattern 200a includes a first coil portion CIL1. A portion of the coil pattern 200b includes a second coil portion CIL2. Portions of the coil pattern 200c include a third coil portion CIL3 and a fourth coil portion CIL4.

The first coil portion CIL1, the third coil portion CIL3, and the interlayer connection conductor 240a are arranged in the Z-axis direction at positions on the negative side in the X-axis direction. The second coil portion CIL2, the fourth coil portion CIL4, and the interlayer connection conductor 240b are arranged in the Z-axis direction at positions on the positive side in the X-axis direction.

When the multilayer substrate 120 is viewed in Z-axis direction, the RFIC chip 160 is located between the first coil portion CIL1 and the second coil portion CIL2. When the multilayer substrate 120 is viewed in Y-axis direction, the RFIC chip 160 is located between the third coil portion CIL3 and the fourth coil portion CIL4.

The first terminal electrode 140a is disposed at a position on the negative side in the X-axis direction. The second terminal electrode 140b is disposed at a position on the positive side in the X-axis direction. Both the first terminal electrode 140a and the second terminal electrode 140b are made of flexible copper foil into a strip shape. The first terminal electrode 140a and the second terminal electrode 140b have the respective principal surface sizes identical or substantially identical to each other. The short sides of the first terminal electrode 140a and the second terminal electrode 140b extend in the X-axis direction. The long sides of the first terminal electrode 140a and the second terminal electrode 140b extend in the Y-axis direction.

Therefore, when the multilayer substrate 120 is viewed in the Y-axis direction, the RFIC chip 160 is interposed between a portion of the power feeding circuit 180 and another portion of the power feeding circuit 180. When the multilayer substrate 120 is viewed in the X-axis direction, the RFIC chip 160 overlaps with the power feeding circuit 180. In a planar view of the multilayer substrate 120, the power feeding circuit 180 partially overlaps with each of the first and second terminal electrodes 140a, 140b.

As shown in FIGS. 16A to 16C, the multilayer substrate 120 includes three laminated sheet-shaped insulation layers 120a to 120c. The insulation layer 120a is located at an upper position, the insulation layer 120b is located at an intermediate position, and the insulation layer 120c is located at a lower position.

The first terminal electrode 140a and the second terminal electrode 140b are provided on one principal surface of the insulation layer 120a. At the center position of one principal surface of the insulation layer 120b, a rectangular or substantially rectangular through-hole HL1 is formed, reaching the other principal surface. The through-hole HL1 has a size sufficient to contain the RFIC chip 160. The coil pattern 200c extending in a belt shape extends around the through-hole HL1 on the one principal surface of the insulation layer 120b. The coil pattern 200c is made of copper foil having flexibility.

One end portion of the coil pattern 200c is disposed at a position overlapping with the first terminal electrode 140a in the planar view and is connected to the first terminal electrode 140a by an interlayer connection conductor 220a extending in the Z-axis direction. The other end portion of the coil pattern 200c is disposed at a position overlapping with the second terminal electrode 140b in the planar view and is connected to the second terminal electrode 140b by an interlayer connection conductor 220b extending in the Z-axis direction. The interlayer connection conductors 220a, 220b include hard metal bulks containing Sn as a main component.

Assuming that the one end portion of the coil pattern 200c is a starting point, the coil pattern 200c extends around the one end portion twice in the counterclockwise direction, extends to near the end portion of the negative side in the Y-axis direction, and then extends into the positive side in the X-axis direction. The coil pattern 200c bends near the end portion of the positive side in the X-axis direction toward the positive side in the Y-axis direction and extends around the other end portion twice in the counterclockwise direction before reaching the other end portion.

The coil patterns 200a, 200b extending in a belt shape are provided on one principal surface of the insulation layer 120c. The coil patterns 200a, 200b are made of copper foil having flexibility. In a planar view of the insulation layers 120b, 120c, one end portion of the coil pattern 200a is disposed at a position somewhat on the negative side in the Y-axis direction as compared to the one end portion of the coil pattern 200c, and the other end portion of the coil pattern 200a (a first coil end T1) is disposed at a position overlapping with a corner portion on the negative side in the X-axis direction and the positive side in the Y-axis direction out of the four corner portions of the rectangular through-hole HL1.

One end portion of the coil pattern 200b is disposed at a position somewhat on the negative side in the Y-axis direction as compared to the other end portion of the coil pattern 200c. The other end portion of the coil pattern 200b (a second coil end T2) is disposed at a position overlapping with a corner portion on the positive side in the X-axis direction and the positive side in the Y-axis direction out of the four corner portions of the rectangular or substantially rectangular through-hole HL1. Both the first coil end T1 and the second coil end T2 are rectangular or substantially rectangular in the planar view of the insulation layer 120c.

Assuming that the one end portion of the coil pattern 200a is a starting point, the coil pattern 200a extends around the one end portion 2.5 times in the clockwise direction and subsequently bends toward the negative side in the Y-axis direction to reach the other end portion. Similarly, assuming that the one end portion of the coil pattern 200b is a starting point, the coil pattern 200b extends around the one end portion 2.5 times in the anticlockwise direction and subsequently bends toward the negative side in the Y-axis direction to reach the other end portion. The one end portion of the coil pattern 200a is connected to the one end portion of the coil pattern 200c by the interlayer connection conductor 240a extending in the Z-axis direction. The one end portion of the coil pattern 200b is connected to the other end portion of the coil pattern 200c by the interlayer connection conductor 240b extending in the Z-axis direction. The interlayer connection conductors 240a, 240b include hard metal bulks containing Sn as a main component.

In the planar view of the insulation layers 120b, 120c, a section of the coil pattern 200a overlaps with a section of the coil pattern 200c, and a section of the coil pattern 200b overlaps with another section of the coil pattern 200c. Between the overlapping sections of the coil patterns 200a, 200c, the section of the coil pattern 200a is defined as a "first coil portion CIL1" and the section of the coil pattern 200c is defined as a "third coil portion CIL3." Between the overlapping sections of the coil patterns 200b, 200c, the section of the coil pattern 200b is defined as a "second coil portion CIL2" and the section of the coil pattern 200c is defined as a "fourth coil portion CIL4." The position of the one end portion of the coil pattern 200a or the one end portion of the coil pattern 200c is defined as a "first position P1" and the position of the one end portion of the coil pattern 200b or the other end portion of the coil pattern 200c is defined as a "second position P2."

Rectangular or substantially rectangular dummy conductors 260a, 260b are provided on the one principal surface of the insulation layer 120c. The dummy conductors 260a, 260b are made of copper foil having flexibility. In the planar view of the insulation layers 120b, 120c, the dummy conductors 260a, 260b are disposed to overlap with two respective corner portions arranged in the X-axis direction on the negative side in the Y-axis direction out of the four corner portions of the rectangular or substantially rectangular through-hole HL1.

The RFIC chip 160 is mounted on the insulation layer 120c such that the four corner portions of the other principal surface respectively face the first coil end T1, the second coil end T2, and the dummy conductors 260a, 260b. The first input/output terminal 160a is disposed on the other principal surface of the RFIC chip 160 to overlap with the first coil end T1 in the planar view. Similarly, the second input/output terminal 160b is disposed on the other principal surface of the RFIC chip 160 to overlap with the second coil end T2 in the planar view.

As a result, the RFIC chip 160 is connected to the first coil end T1 by the first input/output terminal 160a and is connected to the second coil end T2 by the second input/output terminal 160b.

This thickness of the insulation layers 120a to 120c preferably is about 10 μm or greater and about 100 μm or less, for example. Therefore, the RFIC chip 160 and the power feeding circuit 180 built into the multilayer substrate 120 can be seen through on the outside. Therefore, the connection state (presence of a broken wire) of the RFIC chip 160 and the power feeding circuit 180 is easily confirmed.

Figure 18:
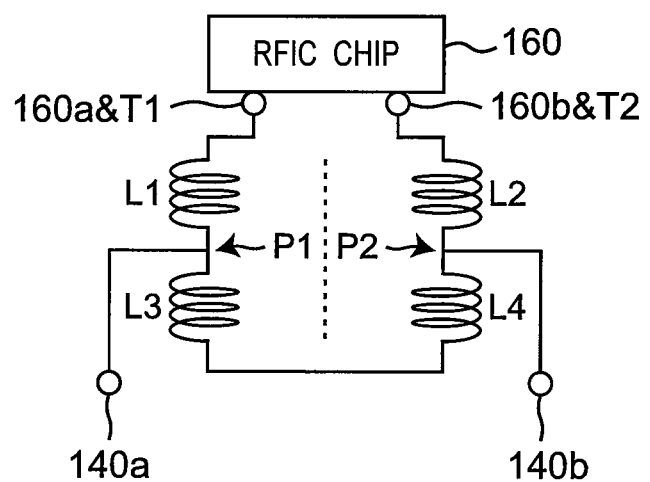
FIG. 18 is a diagram of an equivalent circuit of the RFIC element shown in FIG. 14.

FIG. 18 is a diagram of an equivalent circuit of the RFIC element 100 configured as described above. In FIG. 18, an inductor L1 corresponds to the first coil portion CIL1. An inductor L2 corresponds to the second coil portion CIL2. An inductor L3 corresponds to the third coil portion CIL3. An inductor L4 corresponds to the fourth coil portion CIL4. The characteristics of impedance matching by the power feeding circuit 180 are specified by the values of the inductors L1 to L4.

One end portion of the inductor L1 is connected to the first input/output terminal 160a disposed on the RFIC chip 160. One end portion of the inductor L2 is connected to the second input/output terminal 160b disposed on the RFIC chip 160. The other end portion of the inductor L1 is connected to one end portion of the inductor L3. The other end portion of the inductor L2 is connected to one end portion of the inductor L4. The other end portion of the inductor L3 is connected to the other end portion of the inductor L4. The first terminal electrode 140a is connected to a connection point between the inductors L1, L3. The second terminal electrode 140b is connected to a connection point between the inductors L2, L4.

Figure 19:
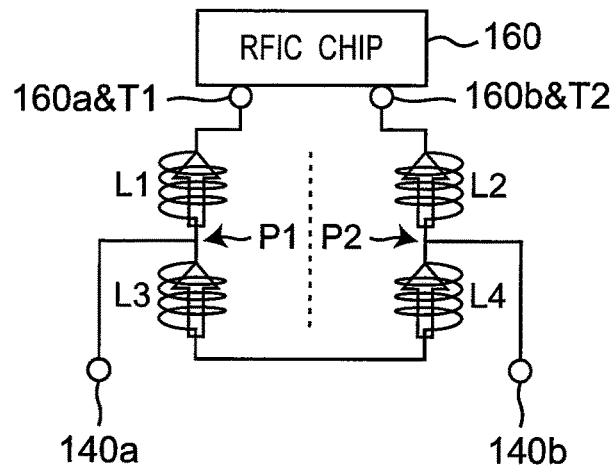
FIG. 19 is a diagram of an example of a state of a magnetic field occurring on the equivalent circuit shown in FIG. 18.

As can be seen from the equivalent circuit shown in FIG. 18, the first coil portion CIL1, the second coil portion CIL2, the third coil portion CIL3, and the fourth coil portion CIL4 are wound to provide magnetic fields in phase and are connected in series to each other. Therefore, the magnetic fields are generated toward a direction indicted by arrows of FIG. 19 at a certain time point. On the other hand, the magnetic fields are generated toward a direction opposite to the direction indicted by the arrows of FIG. 19 at another time point.

As can be seen from FIGS. 16B and 16C, the first coil portion CIL1 and the third coil portion CIL3 have the same or substantially the same loop shape and a same first winding axis. Similarly, the second coil portion CIL2 and the fourth coil portion CIL4 have the same or substantially the same loop shape and a same second winding axis. The first winding axis and the second winding axis are disposed at positions where the RFIC chip 160 is interposed therebetween.

Therefore, the first coil portion CIL1 and the third coil portion CIL3 are magnetically and capacitively coupled. Similarly, the second coil portion CIL2 and the fourth coil portion CIL4 are magnetically and capacitively coupled.

As can be understood from the description, the RFIC chip 160 includes the first input/output terminal 160a and the second input/output terminal 160b and is built into the multilayer substrate 120. The power feeding circuit 180 includes the coil patterns 200a to 200c and is built into the multilayer substrate 120. Among these, the coil pattern 200a has the other end portion (the first coil end T1) connected to the first input/output terminal 160a, and the coil pattern 200b has the other end portion (the second coil end T2) connected to the second input/output terminal 160b. The first terminal electrode 140a and the second terminal electrode 140b are disposed on the one principal surface of the multilayer substrate 120. The first terminal electrode 140a is connected to the one end portion of the coil pattern 200a (the first position P1). The second terminal electrode 140b is connected to the one end portion of the coil pattern 200b (the second position P2).

The first coil portion CIL1 is present in a section from the first coil end T1 to the first position P1 and has the first winding axis in the direction intersecting with the one principal surface of the multilayer substrate 120. The second coil portion CIL2 is present in a section from the second coil end T2 to the second position P2 and has the second winding axis in the direction intersecting with the one principal surface of the multilayer substrate 120. The third coil portion CIL3 is disposed to overlap with the first coil portion CIL1 in the planar view. The fourth coil portion CIL4 is disposed to overlap with the second coil portion CIL2 in the planar view. The first coil portion CIL1/the third coil portion CIL3 and the second coil portion CIL2/the fourth coil portion CIL4 are disposed at positions where the RFIC chip 160 is interposed therebetween. The multilayer substrate 120 has the power feeding circuit 180 that performs impedance matching between the antenna element 12 and the RFIC chip 160 as well as the RFIC chip 160 built-in.

The RFIC chip 160 includes the semiconductor substrate. Therefore, the RFIC chip 160 acts as a ground or a shield for the first coil portion CIL1, the second coil portion CIL2, the third coil portion CIL3, and the fourth coil portion CIL4. Consequently, the first coil portion CIL1 and the second coil portion CIL2 as well as the third coil portion CIL3 and the fourth coil portion CIL4 are hardly magnetically or capacitively coupled to each other. This enables the reduction in the risk of narrowing the passband of communication signals.

Figure 20:
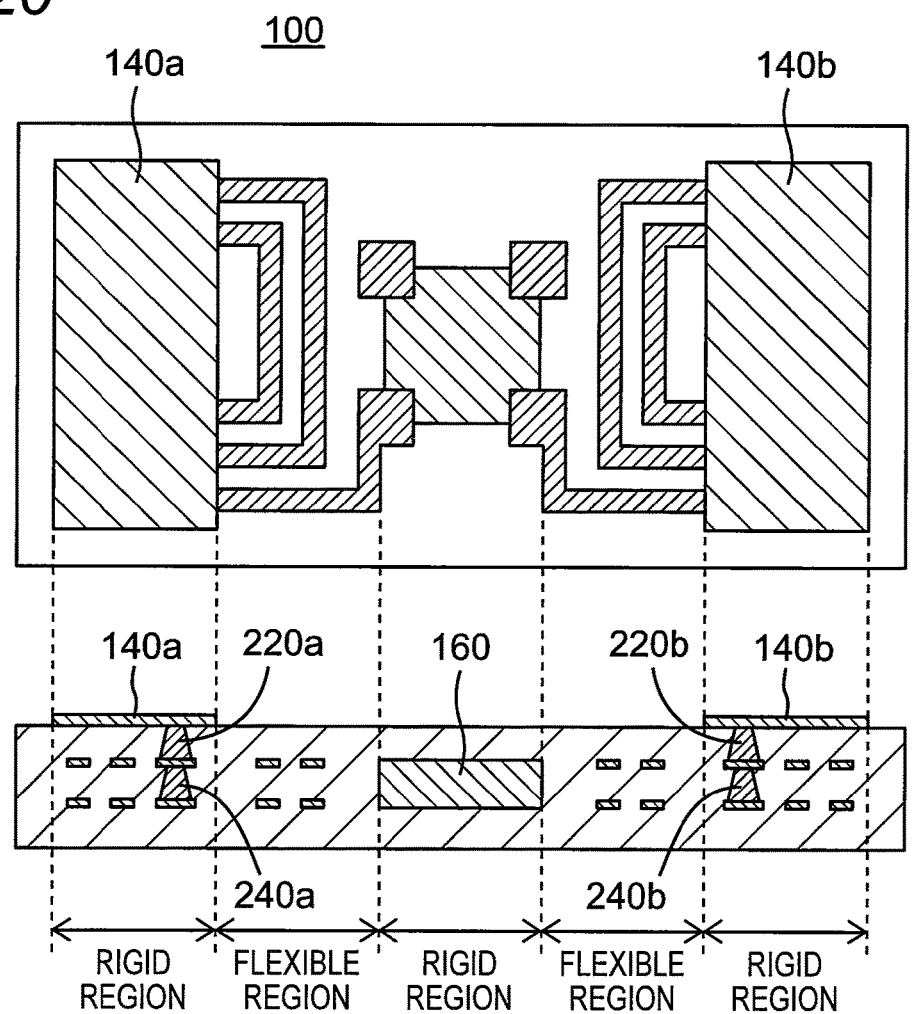
FIG. 20 is a diagram of distribution of rigid and flexible regions in the RFIC element shown in FIG. 14.
Figure 21:
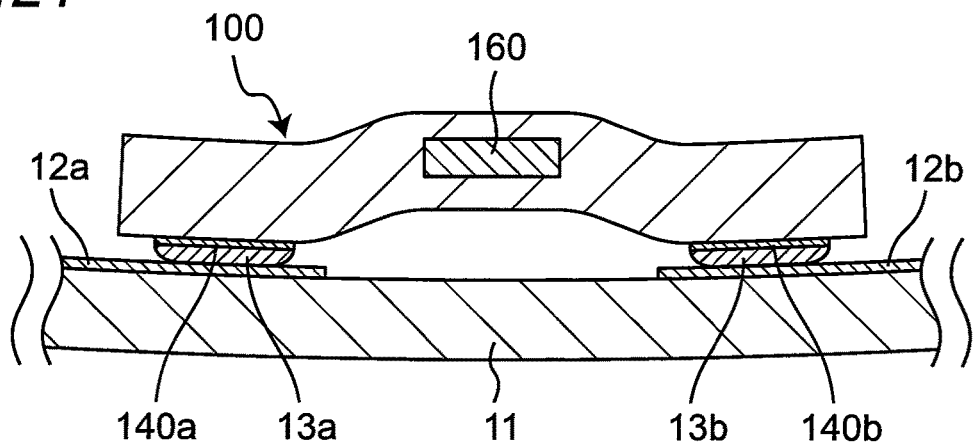
FIG. 21 is a diagram of a bent state of an RFID tag having the RFIC element shown in FIG. 14 attached to an antenna element.

An example of attaching the RFIC element 100 onto the antenna conductors 12a, 12b by conductive bonding materials 13a, 13b will be described. FIG. 20 is a diagram of distribution of rigid and flexible regions in the RFIC element 100. FIG. 21 is a diagram of a bent state of an RFID tag including the RFIC element 100 attached to the antenna conductors 12a, 12b.

As described above, the multilayer substrate 120, the coil patterns 200a to 200c, the first terminal electrode 140a, and the second terminal electrode 140b include members having flexibility. On the other hand, the interlayer connection conductors 220a, 220b, 240a, 240b and the substrate of the RFIC chip 160 include hard members. The first terminal electrode 140a and the second terminal electrode 140b are comparatively large in size and therefore less flexible. If a plating film of Ni/Au or Ni/Sn etc. is applied to the first terminal electrode 140a and the second terminal electrode 140b, the first terminal electrode 140a and the second terminal electrode 140b are further reduced in flexibility.

As a result, rigid regions and flexible regions are provided in the RFIC element 100 as shown in FIG. 20. More specifically, the regions disposed with the first terminal electrode 140a, the second terminal electrode 140b, and the RFIC chip 160 are define as the rigid regions, and the other regions are defined as the flexible regions. Particularly, since the first terminal electrode 140a and the second terminal electrode 140b are disposed at positions away from the RFIC chip 160, the flexible regions are located between the first terminal electrode 140a and the RFIC chip 160 and between the second terminal electrode 140b and the RFIC chip 160.

Therefore, if the RFID tag having the RFIC element 100 affixed to the antenna conductors 12a, 12b of the antenna base material 11 is affixed to a curved surface, the RFIC element 100 is bent as shown in FIG. 21, for example.

Figure 22:
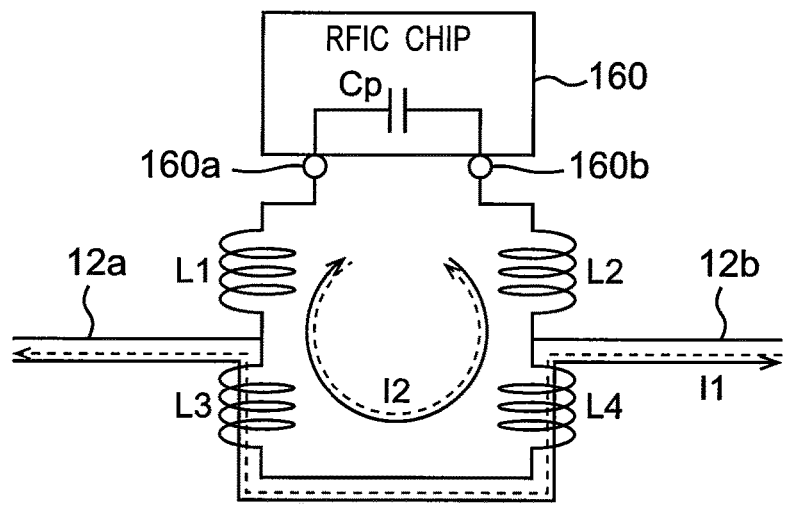
FIG. 22 is a diagram of an example in which a current flows through an equivalent circuit of the RFID tag of FIG. 21.
Figure 23:
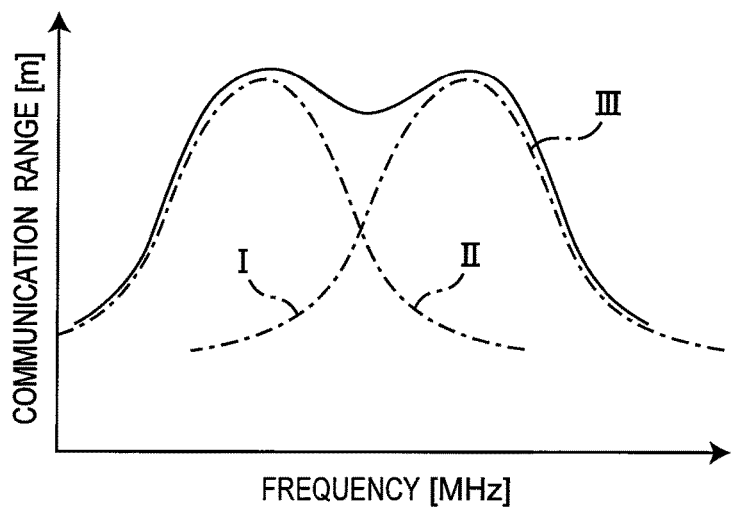
FIG. 23 is a graph of an example of resonance frequency characteristics of the RFID tag of FIG. 21.

FIG. 22 is a diagram of an example in which a current flows through an equivalent circuit of the RFID tag of FIG. 21. FIG. 23 is a graph of an example of resonance frequency characteristics of the RFID tag of FIG. 21

As shown in FIG. 22, the RFIC chip 160 itself has a parasitic capacitance (stray capacitance) Cp present between the first input/output terminal 160a and the second input/output terminal 160b. Therefore, two resonances are generated in the RFIC element 100. The first resonance is the resonance generated in a current path including the antenna conductors 12a, 12b and the inductors L3, L4. The second resonance is the resonance generated in a current path (current loop) including the inductors L1 to L4 and the parasitic capacitance Cp. These two resonances are coupled by the inductors L3 to L4 shared by the current paths. Two respective currents I1 and I2 corresponding to the two resonances flow as indicated by a dotted line in FIG. 22.

Both a first resonance frequency and a second resonance frequency are affected by the inductors L3 to L4. A difference of several dozen MHz (specifically, about 5 MHz or more to about 50 MHz or less, for example) is generated between the first resonance frequency and the second resonance frequency. The resonance frequency characteristics thereof are represented by curves I and II in FIG. 21. By combining the two resonances having such resonance frequencies, broadband resonance frequency characteristics are produced as indicated by a curve III in FIG. 23.

Second Preferred Embodiment

Figure 24:
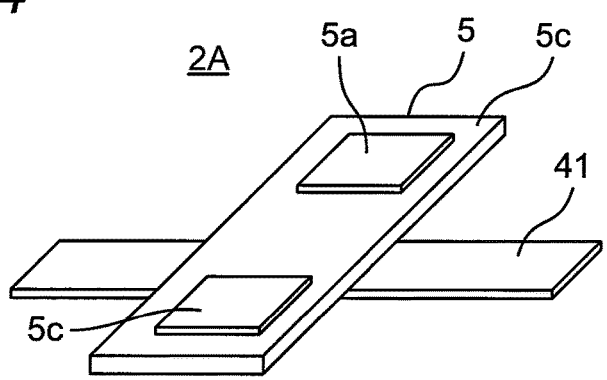
FIG. 24 is a perspective view of a general configuration of an electronic component with a seal material according to a second preferred embodiment of the present invention.
Figure 25:
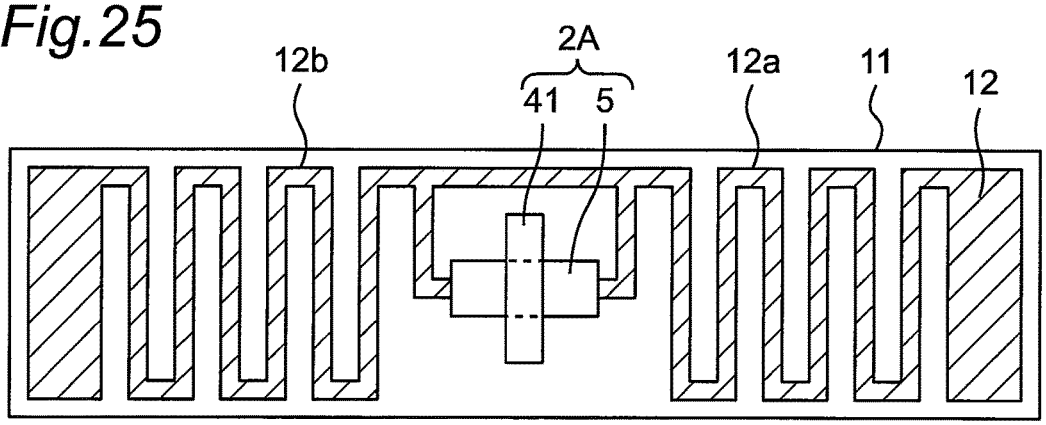
FIG. 25 is a plane view of a state of the electronic component with a seal material of FIG. 24 attached to an antenna element of an antenna base material.

FIG. 24 is a perspective view of a general configuration of an electronic component 2A with a seal material according to a second preferred embodiment of the present invention. FIG. 25 is a plane view of a state of the electronic component 2A with a seal material of FIG. 24 attached to the antenna element 12 of the antenna base material 11. The second preferred embodiment is different from the first preferred embodiment in that a seal material 41 of the electronic component 2A with a seal material is smaller in size than the seal material 4.

As shown in FIG. 24, the seal material 41 preferably has a rectangular or substantially rectangular belt shape. The seal material 41 is attached to a portion of the fixation surface of the electronic component 5 to extend in a direction intersecting with (e.g., perpendicular or substantially perpendicular to) the longitudinal direction of the electronic component 5.

The seal material 41 shaped and sized as above also ensures the electric connection between the terminal electrodes 5a, 5b of the electronic component 5 and the antenna conductors 12a, 12b, and eliminates the need for direct fixation using ultrasonic bonding etc. or fixation using a bonding material.

Figure 26:
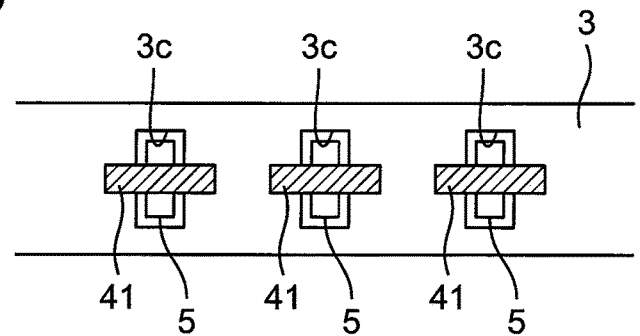
FIG. 26 is a bottom view of a state of the electronic component with a seal material of FIG. 24 in which the portions other than those defining and functioning as the seal materials are separated from a tape-shaped main body.

The seal material 41 is able to be manufactured using the manufacturing steps for the carrier tape described above with reference to FIG. 4D by forming cuts to separate a portion defining and functioning as the seal material 41 including a portion partially overlapping with each of the housing holes 3c in a planar view from the other portions. FIG. 26 is a bottom view of a state in which the portions other than those defining and functioning as the seal materials 41 are separated from the tape-shaped main body 3 after the formation of the cuts. In this case, the seal materials 41 do not completely cover the housing holes 3c, generating portions exposing the housing holes 3c.

Although the one seal material 41 preferably is disposed for each of the electronic components 5 in the second preferred embodiment, this is not a limitation of the present invention. For example, the two or more seal materials 41 may be disposed for each of the electronic components 5.

Third Preferred Embodiment

Figure 27:
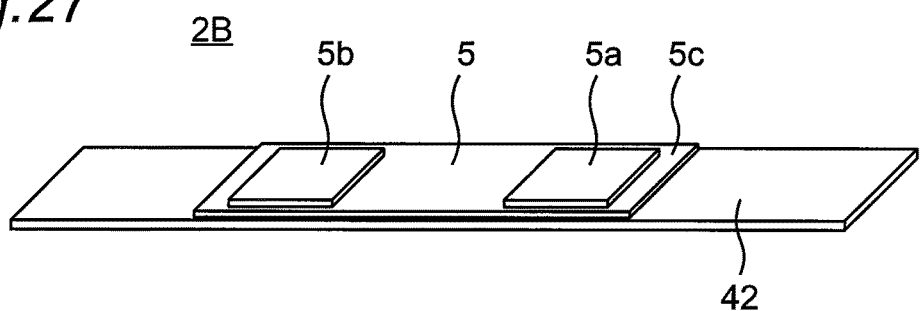
FIG. 27 is a perspective view of a general configuration of an electronic component with a seal material according to a third preferred embodiment of the present invention.
Figure 28:
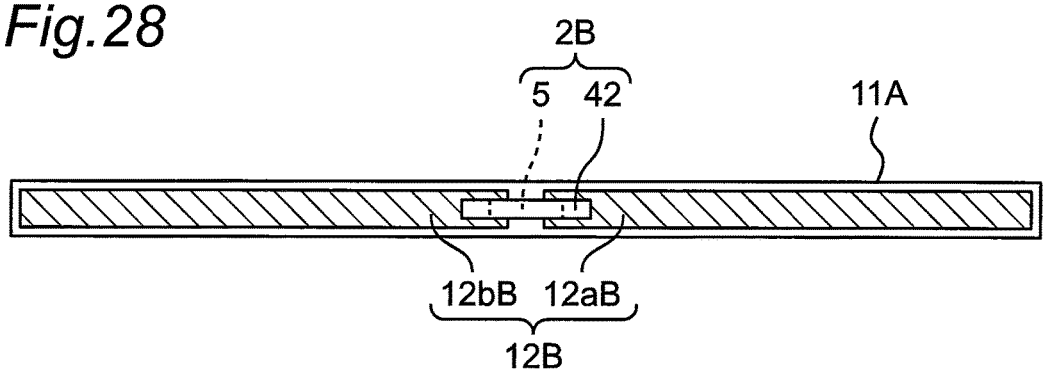
FIG. 28 is a plane view of a state of the electronic component with a seal material of FIG. 27 attached to an antenna element of an antenna base material.

FIG. 27 is a perspective view of a general configuration of an electronic component 2B with a seal material according to a third preferred embodiment of the present invention. FIG. 28 is a plane view of a state of the electronic component 2B with a seal material of FIG. 27 attached to an antenna element 12B of an antenna base material 11B. The third preferred embodiment is different from the first preferred embodiment in that a seal material 42 of the electronic component 2B with a seal material is smaller in width than the seal material 4 and that antenna conductors 12aB, 12bB of the antenna element 12B preferably have an elongated rectangular or substantially rectangular belt shape.

As shown in FIG. 27, the seal material 42 is attached to the fixation surface of the electronic component 5 to extend in the longitudinal direction of the electronic component 5. The length of the seal material 42 in the transverse direction and the length of the electronic component 5 in the transverse direction are the same or substantially the same. The seal material 42 has the length in the longitudinal direction longer than the length of the electronic component 5 in the longitudinal direction and is sized to protrude from both end portions of the electronic component 5 in the longitudinal direction.

The seal material 42 shaped and sized as above also ensures the electric connection between the terminal electrodes 5a, 5b of the electronic component 5 and the antenna conductors 12a, 12b, and eliminates the need for direct fixation using ultrasonic bonding etc. or fixation using a bonding material. Since the width of the electronic component 2B with a seal material is able to be narrowed, the widths of the antenna base material 11B and the antenna conductors 12aB, 12bB of the antenna element 12B are able to be narrowed so that, for example, the component is able to be affixed to an outer circumferential surface of a circular plate-shaped disk such as a DVD.

In the third preferred embodiment, the antenna element 12B defines and functions as a dipole antenna. The antenna conductors 12aB, 12bB have common widths and lengths.

The width of the antenna conductors 12aB, 12bB is smaller than the width of the antenna base material 11B. The width of the antenna base material 11B is about 1 mm, for example. The length of the antenna conductors 12aB, 12bB is less than a half of the length of the antenna base material 11B.

Figure 29:
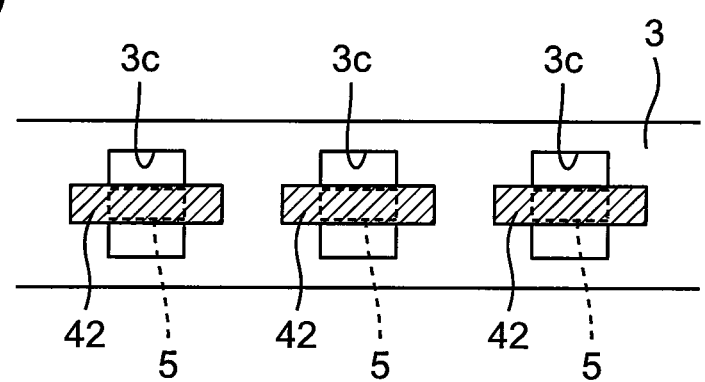
FIG. 29 is a bottom view of a state of the electronic component with a seal material of FIG. 27 in which the portions other than those defining and functioning as the seal member are separated from the tape-shaped main body.

The seal material 42 is able to be manufactured in the manufacturing steps for the carrier tape described above with reference to FIG. 4D by forming cuts to separate a portion defining and functioning as the seal material 42 including a portion partially overlapping with each of the housing holes 3c in a planar view from the other portions. FIG. 29 is a bottom view of a state in which the portions other than those defining and functioning as the seal materials 42 are separated from the tape-shaped main body 3 after the formation of the cuts. In this case, the seal materials 42 do not completely cover the housing holes 3c, generating portions exposing the housing holes 3c.

The preferred embodiments of the present invention are illustrative and the constituent elements described in the different preferred embodiments can be partially replaced or combined. In the second and later preferred embodiments, the details common to the first preferred embodiment are not described and only the differences are described. Particularly, the same actions and effects of the same constituent elements are not repeatedly mentioned for each of the preferred embodiments.

Although the present invention has been sufficiently described in terms of preferred embodiments with reference to the accompanying drawings, various modifications and corrections are apparent to those skilled in the art. It should be understood that such modifications and corrections are included in the present invention without departing from the scope of the present invention according to the accompanying claims.

Since the handleability of the electronic components with seal materials is improved, preferred embodiments of the present invention are useful for manufacturing of RFID tags, a carrier tape used in the manufacturing, and a method for manufacturing the same.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A carrier tape housing a plurality of electronic components with seal materials, the carrier tape comprising:
   a tape-shaped main body including a first principal surface and a second principal surface and including a plurality of housing holes penetrating from the first principal surface to the second principal surface along a longitudinal direction;
   a plurality of seal materials each having an adhesive layer on one principle surface and affixed to the second principal surface of the tape-shaped main body such that the adhesive layer is exposed in at least a portion of each of the housing holes; and
   a plurality of chip-shaped electronic components housed in the respective housing holes and fixed to the adhesive layers of the respective seal materials; wherein
   the seal materials have rigidity higher than the tape-shaped main body.

2. The carrier tape of claim 1, wherein the electronic components are components defining RFID tags and each includes an RFIC chip and a substrate with the RFIC chip mounted thereon.

3. The carrier tape of claim 2, wherein the substrate is a substrate of an RFID tag and includes a power feeding circuit that performs impedance matching between an antenna element and the RFIC chip.

4. The carrier tape of claim 1, wherein a tape-shaped cover material is affixed to the first principal surface of the tape-shaped main body to cover the plurality of the housing holes housing the electronic components.

5. The carrier tape of claim 1, wherein the electronic component includes a terminal electrode on a surface on the side opposite to a fixation surface fixed to the adhesive layer of the seal material.

6. A carrier tape housing a plurality of electronic components with seal materials, the carrier tape comprising:
   a tape-shaped main body including a first principal surface and a second principal surface and including a plurality of housing holes penetrating from the first principal surface to the second principal surface along a longitudinal direction;
   a plurality of seal materials each having an adhesive layer on one principle surface and affixed to the second principal surface of the tape-shaped main body such that the adhesive layer is exposed in at least a portion of each of the housing holes; and
   a plurality of chip-shaped electronic components housed in the respective housing holes and fixed to the adhesive layers of the respective seal materials; wherein
   the electronic components are components defining RFID tags and each includes an RFIC chip and a substrate with the RFIC chip mounted thereon; and
   the substrate is a substrate of an RFID tag and includes a power feeding circuit that performs impedance matching between an antenna element and the RFIC chip.

7. The carrier tape of claim 6, wherein the seal materials have rigidity higher than the tape-shaped main body.

8. The carrier tape of claim 6, wherein a tape-shaped cover material is affixed to the first principal surface of the tape-shaped main body to cover the plurality of the housing holes housing the electronic components.

9. The carrier tape of claim 6, wherein the electronic component includes a terminal electrode on a surface on the side opposite to a fixation surface fixed to the adhesive layer of the seal material.

\* \* \* \* \*